(12) United States Patent
Fang

(10) Patent No.: US 11,282,772 B2
(45) Date of Patent: Mar. 22, 2022

(54) PACKAGE STRUCTURE, ASSEMBLY STRUCTURE AND METHOD FOR MANUFACTURING THE SAME

(71) Applicant: Advanced Semiconductor Engineering, Inc., Kaohsiung (TW)

(72) Inventor: Hsu-Nan Fang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 16/676,280

(22) Filed: Nov. 6, 2019

(65) Prior Publication Data

US 2021/0134711 A1 May 6, 2021

(51) Int. Cl.
| | |
|---|---|
| *H01L 23/498* | (2006.01) |
| *H01L 23/29* | (2006.01) |
| *H01L 23/31* | (2006.01) |
| *H01L 23/00* | (2006.01) |
| *H01L 21/56* | (2006.01) |
| *H01L 21/463* | (2006.01) |
| *H01L 21/48* | (2006.01) |
| *H01L 25/065* | (2006.01) |
| *H01L 23/538* | (2006.01) |

(Continued)

(52) U.S. Cl.
CPC ...... *H01L 23/49816* (2013.01); *H01L 21/463* (2013.01); *H01L 21/4864* (2013.01); *H01L 21/563* (2013.01); *H01L 21/6835* (2013.01); *H01L 23/29* (2013.01); *H01L 23/3128* (2013.01); *H01L 23/49811* (2013.01); *H01L 23/5383* (2013.01); *H01L 23/5389* (2013.01); *H01L 24/13* (2013.01); *H01L 24/43* (2013.01); *H01L 24/45* (2013.01); *H01L 24/73* (2013.01); *H01L 25/0652* (2013.01); *H01L 25/0655* (2013.01); *H01L 25/50* (2013.01); *H01L 23/145* (2013.01); *H01L 23/4334* (2013.01); *H01L 2224/48165* (2013.01); *H01L 2224/73207* (2013.01)

(58) Field of Classification Search
CPC .......... H01L 23/49816; H01L 23/3128; H01L 21/4864; H01L 24/73; H01L 24/43; H01L 21/463; H01L 21/563; H01L 24/45; H01L 23/29; H01L 24/13; H01L 2224/48165; H01L 2224/73207
See application file for complete search history.

(56) References Cited

U.S. PATENT DOCUMENTS 7,064,419 B1* 6/2006 Bayan .................. H01L 21/561
257/666
10,510,634 B2* 12/2019 Lin ....................... H01L 21/565
(Continued)

*Primary Examiner* — Ahmed N Sefer
(74) *Attorney, Agent, or Firm* — Foley & Lardner LLP

(57) ABSTRACT

A package structure includes at least one electronic device, a protection layer and an encapsulant. The electronic device has a first surface and includes a plurality of bumps disposed adjacent to the first surface thereof. Each of the bumps has a first surface. The protection layer covers the bumps and the first surface of the electronic device, and has a first surface. The encapsulant covers the protection layer and at least a portion of the electronic device, and has a first surface. The first surfaces of the bumps, the first surface of the protection layer and the first surface of the encapsulant are substantially coplanar with each other.

15 Claims, 28 Drawing Sheets

(51) Int. Cl.
*H01L 25/00* (2006.01)
*H01L 21/683* (2006.01)
*H01L 23/14* (2006.01)
*H01L 23/433* (2006.01)

(56) References Cited

U.S. PATENT DOCUMENTS

| | | | |
|---|---|---|---|
| 2014/0175663 A1* | 6/2014 | Chen | H01L 23/49827 |
| | | | 257/774 |
| 2015/0187607 A1* | 7/2015 | Huang | H01L 23/28 |
| | | | 438/126 |
| 2015/0200179 A1* | 7/2015 | Do | H01L 21/568 |
| | | | 438/126 |
| 2016/0056055 A1* | 2/2016 | Ko | H01L 23/49822 |
| | | | 438/107 |
| 2016/0189980 A1* | 6/2016 | Paek | H01L 21/4857 |
| | | | 438/126 |
| 2018/0069163 A1* | 3/2018 | Clark | H01L 33/58 |
| 2018/0130749 A1* | 5/2018 | Tsai | H01L 23/5386 |
| 2018/0301352 A1* | 10/2018 | Hsu | H01L 23/5389 |
| 2018/0301420 A1* | 10/2018 | Kim | H01L 23/5383 |
| 2019/0006256 A1* | 1/2019 | Huang | H01L 24/16 |
| 2019/0051621 A1* | 2/2019 | Liu | H01L 21/4853 |
| 2019/0080975 A1* | 3/2019 | Lee | H01L 24/13 |
| 2019/0115319 A1* | 4/2019 | Hiner | H01L 21/6835 |
| 2019/0148250 A1* | 5/2019 | Yu | H01L 23/5383 |
| | | | 257/773 |
| 2019/0252363 A1* | 8/2019 | Lin | H01L 23/24 |
| 2019/0385989 A1* | 12/2019 | Yu | H01L 21/6835 |
| 2020/0006274 A1* | 1/2020 | Chiang | H01L 21/568 |
| 2020/0082885 A1* | 3/2020 | Lin | G11C 11/1675 |
| 2020/0294964 A1* | 9/2020 | Min | H01L 21/565 |
| 2020/0321257 A1* | 10/2020 | Kang | H01L 23/49816 |
| 2020/0335441 A1* | 10/2020 | Kim | H01L 24/17 |
| 2020/0365571 A1* | 11/2020 | Chen | H01L 23/5389 |

* cited by examiner

PACKAGE STRUCTURE, ASSEMBLY STRUCTURE AND METHOD FOR MANUFACTURING THE SAME

BACKGROUND

1. Field of the Disclosure

The present disclosure relates to a package structure, an assembly structure, and a manufacturing method, and to a package structure including at least one electronic device covered by an encapsulant, an assembly structure including the same, and a method for manufacturing the same.

2. Description of the Related Art

In the chip-last process, a semiconductor die may be electrically connected to a plurality of pads of a circuit layer of a wiring structure through a plurality of copper bumps. Since the coefficient of thermal expansion (CTE) of the wiring structure is greater than the CTE of the semiconductor die, the peripheral pads of the circuit layer may generate a large outward displacement relative to the central pads due to thermal expansion in a reflow process, thereby causing a misalignment between the peripheral pads of the wiring structure and the copper bumps of the semiconductor die. Said misalignment may cause the copper bumps to crack during a reliability test. In a worst case, some of the copper-pillar bumps of the semiconductor die may not be bonded to the predetermined pads of the RDL.

SUMMARY

In some embodiments, a package structure includes at least one electronic device, a protection layer and an encapsulant. The electronic device has a first surface and includes a plurality of bumps disposed adjacent to the first surface thereof. Each of the bumps has a first surface. The protection layer covers the bumps and the first surface of the electronic device, and has a first surface. The encapsulant covers the protection layer and at least a portion of the electronic device, and has a first surface. The first surfaces of the bumps, the first surface of the protection layer and the first surface of the encapsulant are substantially coplanar with each other.

In some embodiments, an assembly structure includes a package structure and a wiring structure. The package structure includes at least one electronic device, a protection layer and an encapsulant. The electronic device has a first surface and includes a plurality of bumps disposed adjacent to the first surface thereof. Each of the bumps has a first surface. The protection layer covers the bumps and the first surface of the electronic device, and has a first surface. The encapsulant covers the protection layer and at least a portion of the electronic device, and has a first surface. The first surfaces of the bumps, the first surface of the protection layer and the first surface of the encapsulant are substantially coplanar with each other. The wiring structure is disposed on the first surface of the package structure and electrically connected to the bumps of the electronic device.

In some embodiments, a manufacturing method includes: (a) providing a carrier; (b) forming a base circuit layer on the carrier; (c) providing at least one electronic device including a plurality of connecting elements; (d) attaching the connecting elements of the at least one electronic device to the base circuit layer through a self-aligning material; (e) forming an encapsulant to cover at least a portion of the at least one electronic device; (f) removing the carrier; and (g) forming a wiring structure on the encapsulant.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
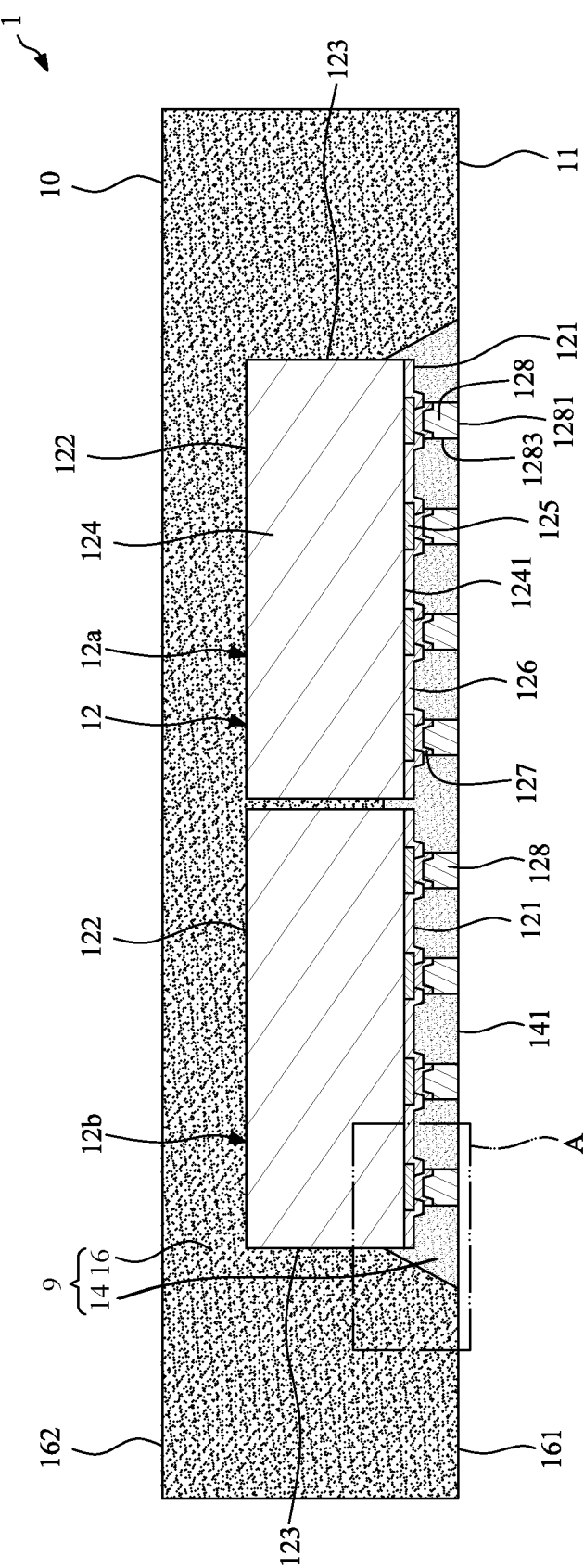
FIG. 1 illustrates a cross-sectional view of a package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

The following disclosure provides many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

At least some embodiments of the present disclosure provide for a package structure which has an improved warpage resistance. In some embodiments, an assembly structure includes such package structure so as to improve a yield thereof. At least some embodiments of the present disclosure further provide for techniques for manufacturing the package structure and the assembly structure.

Figure 2:
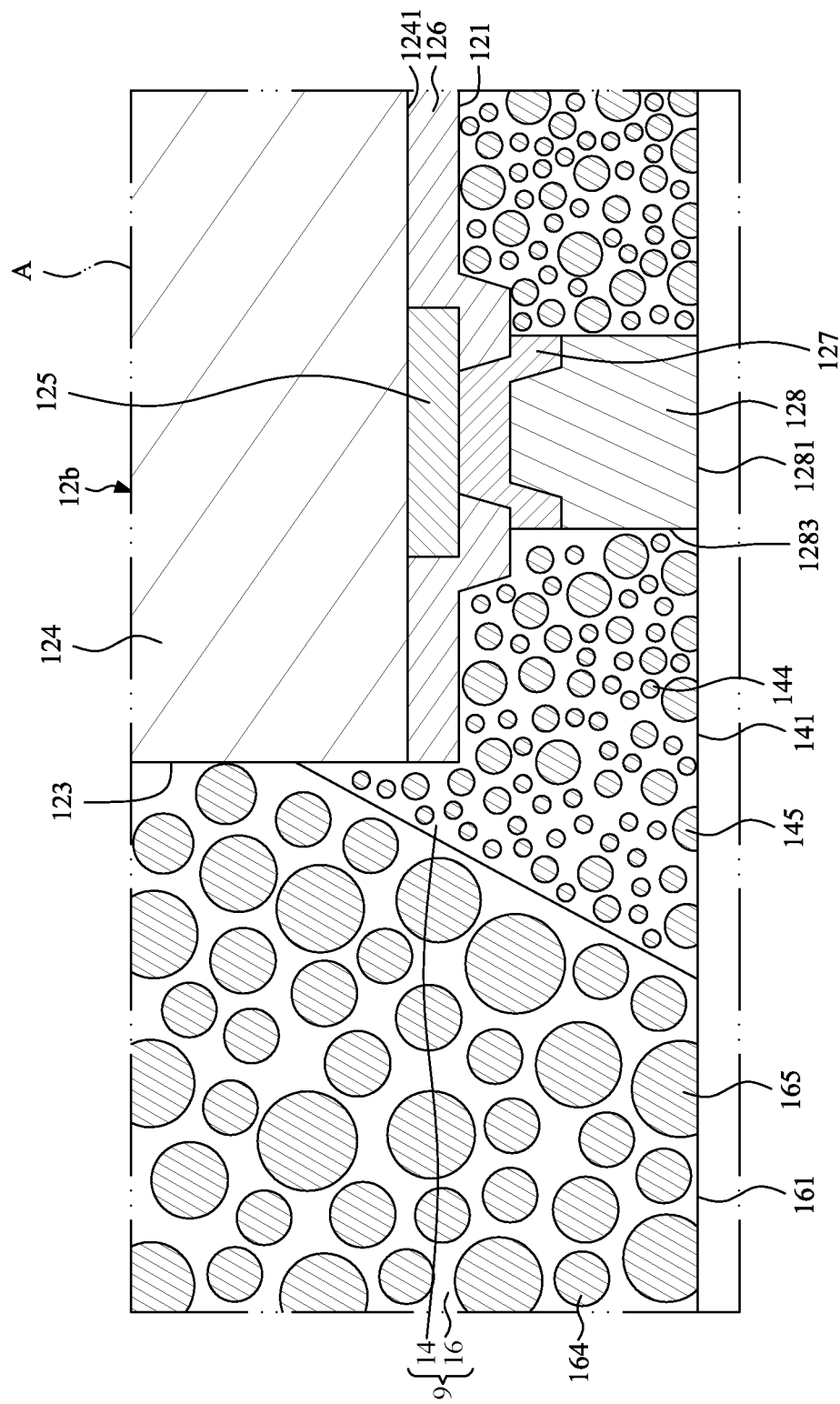
FIG. 2 illustrates an enlarged view of a region "A" in FIG. 1.

FIG. 1 illustrates a cross-sectional view of a package structure 1 according to some embodiments of the present disclosure. FIG. 2 illustrates an enlarged view of a region "A" in FIG. 1. The package structure 1 may have a first surface 11 and a second surface 10 opposite to the first surface 11. The package structure 1 may include at least one electronic device 12 and a package body 9 (which includes a protection layer 14 and an encapsulant 16).

The at least one electronic device 12 may include a first electronic device 12a and a second electronic device 12b disposed side by side, and a gap between the first electronic device 12a and the second electronic device 12b may be in a range of 2 µm to 50 µm, or 2 µm to 10 µm. The function and size of the first electronic device 12a may be same as or different from the function and size of the second electronic device 12b. In some embodiments, the first electronic device 12a has a first surface 121, a second surface 122 opposite to the first surface 121, and a periphery lateral surface 123 extending between the first surface 121 and the second surface 122. The first electronic device 12a may include a main body 124, a plurality of pads 125, a passivation layer 126, a plurality of under bump metallurgies (UBMs) 127, and a plurality of bumps 128. A material of the main body 124 may include silicon, germanium, and/or other suitable material. The pads 125 may be disposed on a first surface 1241 of the main body 124. Alternatively, the pads 125 may be in proximity to, or embedded in and exposed at the first surface 121 of the first electronic device 12a. In some embodiments, the pads 125 may be included in a circuit layer, the material of which is aluminum, copper or an alloy or a mixture of aluminum-copper. The passivation layer 126 covers the pads 125 and the first surface 1241 of the main body 124, and defines a plurality of openings to expose a portion of each of the pads 125. The passivation layer 126 may be a solder mask (the material of which is, for example, PI), an oxide layer or a nitride layer. The UBMs 127 are disposed at the openings of the passivation layer 126, and contact the pads 125. The bumps 128 are disposed on the UBMs 127. Thus, the bumps 128 are disposed adjacent to the first surface 121 of the first electronic device 12a. Each of the bumps 128 has a first surface 1281 and a periphery surface 1283.

In some embodiments, each of the bumps 128 may be an integral structure or a monolithic structure. A cross-section of the periphery surface 1283 of each of the bumps 128 is a substantially straight line. Alternatively, a curvature of a cross-section of the periphery surface 1283 of each of the bumps 128 is continuous. Further, a material of the bumps 128 may include a substantially pure metal such as copper, aluminum, gold or other suitable material. That is, the bumps 128 may not further include an additional material (e.g., solder material (AgSn alloy)) on the first surface 1281 thereof.

The protection layer 14 (e.g., underfill) may cover the periphery surface 1283 of each of the bumps 128 and the first surfaces 121 of the first electronic device 12a and the second electronic device 12b. As shown in FIG. 1, the protection layer 14 may further extend into the gap between the first electronic device 12a and the second electronic device 12b. The protection layer 14 may have a first surface 141. In some embodiments, the protection layer 14 tapers from the first surface 141 of the protection layer 14 toward the first electronic device 12a and the second electronic device 12b. That is, the protection layer 14 tapers upward. In addition, the protection layer 14 may include a plurality of fillers 144. As shown in FIG. 1, the protection layer 14 may include a plurality of truncated fillers 145 exposed on the first surface 141 of the protection layer 14. That is, a flat end surface of each of the truncated fillers 145 is substantially coplanar with the first surface 141 of the protection layer 14.

The encapsulant 16 (e.g., molding compound) may cover the protection layer 14 and at least portions of the first electronic device 12a and the second electronic device 12b.

As shown in FIG. 1, the encapsulant 16 may have a first surface 161 and a second surface 162 opposite to the first surface 161. In some embodiments, the first surfaces 1281 of the bumps 128, the first surface 141 of the protection layer 14 and the first surface 161 of the encapsulant 16 are substantially coplanar with each other, since they may be formed concurrently by a grinding stage. In addition, the encapsulant 16 may include a plurality of fillers 164. As shown in FIG. 1, the encapsulant 16 may include a plurality of truncated fillers 165 exposed on the first surface 161 of the encapsulant 16. That is, a flat end surface of each of the truncated fillers 165 is substantially coplanar with the first surface 161 of the encapsulant 16. In some embodiments, a particle size of the fillers 144 of the protection layer 14 is smaller than a particle size of the fillers 164 of the encapsulant 16. For example, a particle size of the fillers 144 of the protection layer 14 may be less than 5 μm, 3 μm, or 1 μm, and a particle size of the fillers 164 of the encapsulant 16 may be greater than 5 μm, 10 μm, or 15 μm. In some embodiments, the protection layer 14 may not include any filler.

As shown in the embodiment illustrated in FIG. 1, the first surface 11 of the package structure 1 may include the first surfaces 1281 of the bumps 128, the first surface 141 of the protection layer 14 and the first surface 161 of the encapsulant 16. A flatness of the first surface 11 of the package structure 1 may be less than 15 μm, 10 μm or 5 μm, and a surface roughness (Ra) of the first surface 11 of the package structure 1 may be less than 0.1 μm. Thus, a fine line circuit layer may be formed on the first surface 11 of the package structure 1. For example, the fine line circuit layer may have a line width/line space (L/S) with 5 μm/5 μm, 2 μm/2 μm, or less. In addition, the particle size of the fillers 144 of the protection layer 14 may be smaller than the particle size of the fillers 164 of the encapsulant 16, thus, the large particle size of the fillers 164 of the encapsulant 16 may not damage the bumps 128 during the grinding stage.

Figure 3:
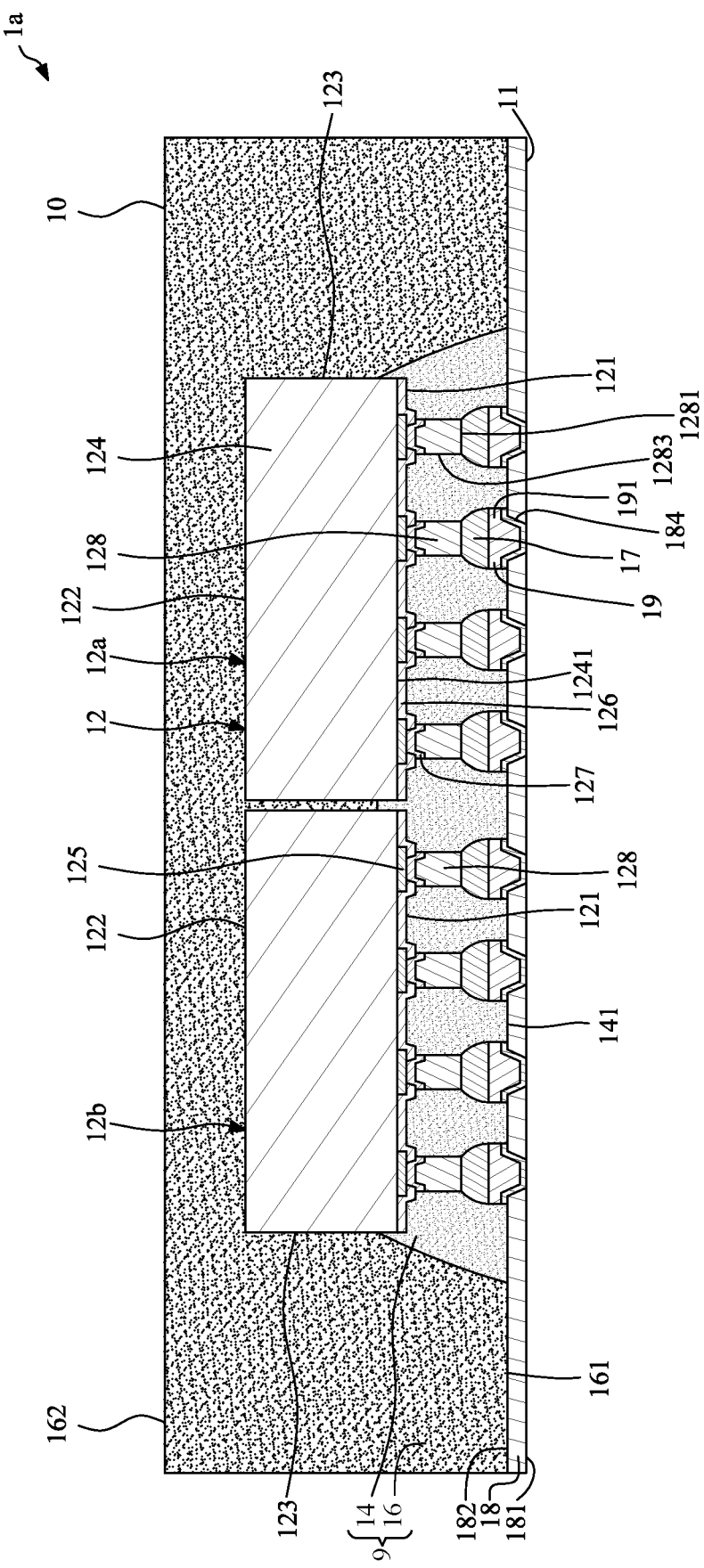
FIG. 3 illustrates a cross-sectional view of a package structure according to some embodiments of the present disclosure.

FIG. 3 illustrates a cross-sectional view of a package structure 1a according to some embodiments of the present disclosure. The package structure 1a of FIG. 3 is similar to the package structure 1 of FIG. 1 and FIG. 2 except that a plurality of self-aligning materials 17, a base dielectric layer 18 and a base circuit layer 19 are further included. The base dielectric layer 18 may include, or be formed from, a photoresist layer, a cured photosensitive material, a cured photoimageable dielectric (PID) material such as a polyamide (PA), an Ajinomoto build-up film (ABF), a bismaleimide-triazine (BT), a polyimide (PI), epoxy or polybenzoxazole (PBO), or a combination of two or more thereof. As shown in FIG. 3, the base dielectric layer 18 may have a first surface 181 and a second surface 182 opposite to the first surface 181, and may define a plurality of openings 184 extending through the base dielectric layer 18. The base dielectric layer 18 may be a single layer. The base circuit layer 19 may include a plurality of pads 191 embedded in the openings 184 of the base dielectric layer 18, and/or protruding from the second surface 182 of the base dielectric layer 18.

The bumps 128 of the first electronic device 12a and the second electronic device 12b are attached or bonded to the pads 191 of the base circuit layer 19 through the self-aligning materials 17 (e.g., solder materials). In some embodiments, the protection layer 14 (e.g., underfill) may cover the periphery surface 1283 of each of the bumps 128, the first surfaces 121 of the first electronic device 12a and the second electronic device 12b, the self-aligning materials 17 (e.g., solder materials), and a portion of the second surface 182 of the base dielectric layer 18. The encapsulant 16 (e.g., molding compound) may cover the protection layer 14, at least portions of the first electronic device 12a and the second electronic device 12b, and a portion of the second surface 182 of the base dielectric layer 18. As shown in FIG. 3, the openings 184 of the base dielectric layer 18 (or the pads 191 of the base circuit layer 19) taper downward, and the first surface 181 of the base dielectric layer 18 is the first surface 11 of the package structure 1a.

Figure 4:
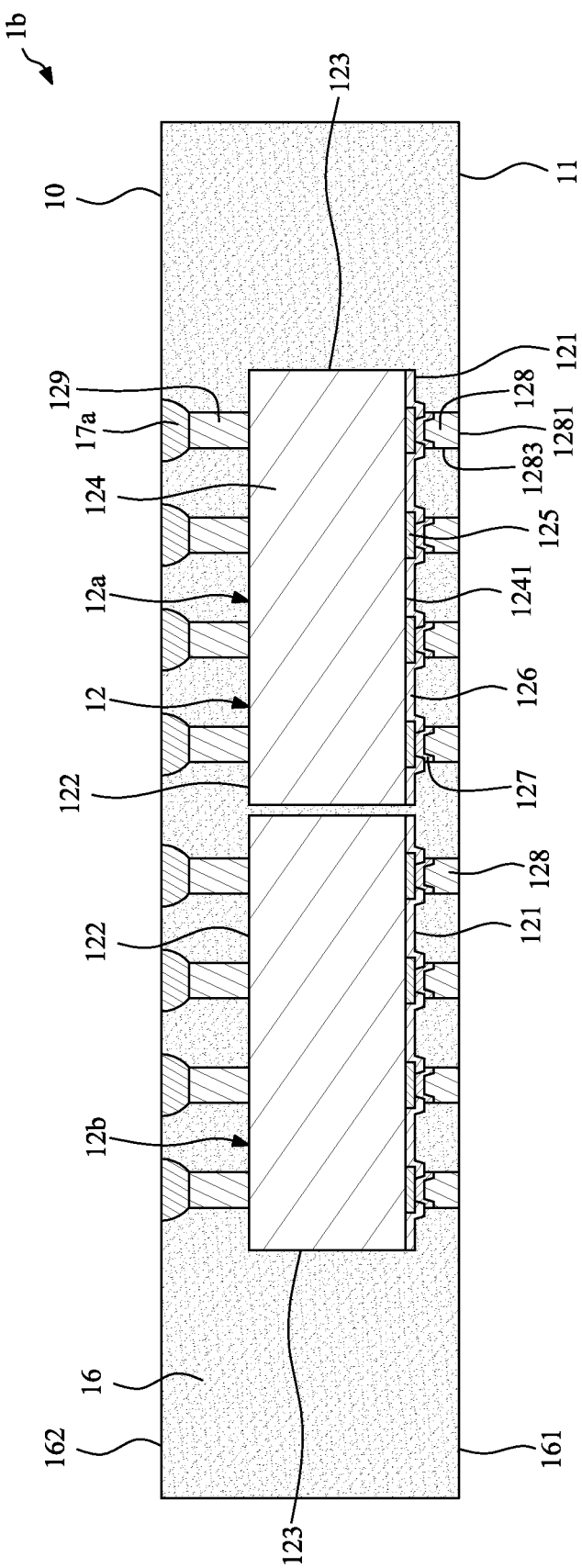
FIG. 4 illustrates a cross-sectional view of a package structure according to some embodiments of the present disclosure.

FIG. 4 illustrates a cross-sectional view of a package structure 1b according to some embodiments of the present disclosure. The package structure 1b of FIG. 4 is similar to the package structure 1 of FIG. 1 and FIG. 2 except that a plurality of pillars 129 and a plurality of self-aligning materials 17a are further included, and the protection layer 14 is omitted. The pillars 129 may be disposed on the second surfaces 122 of the first electronic device 12a and the second electronic device 12b. In some embodiments, the pillars 129 may be dummy pillars that have no electrical function. That is, the pillars 129 may be not electrically connected to any circuit layer of the first electronic device 12a and the second electronic device 12b. The self-aligning materials 17a (e.g., solder materials) may be disposed on the respective ones of the pillars 129. The top end of each of the self-aligning materials 17a may be exposed from and/or coplanar with the second surface 162 of the encapsulant 16.

Figure 5:
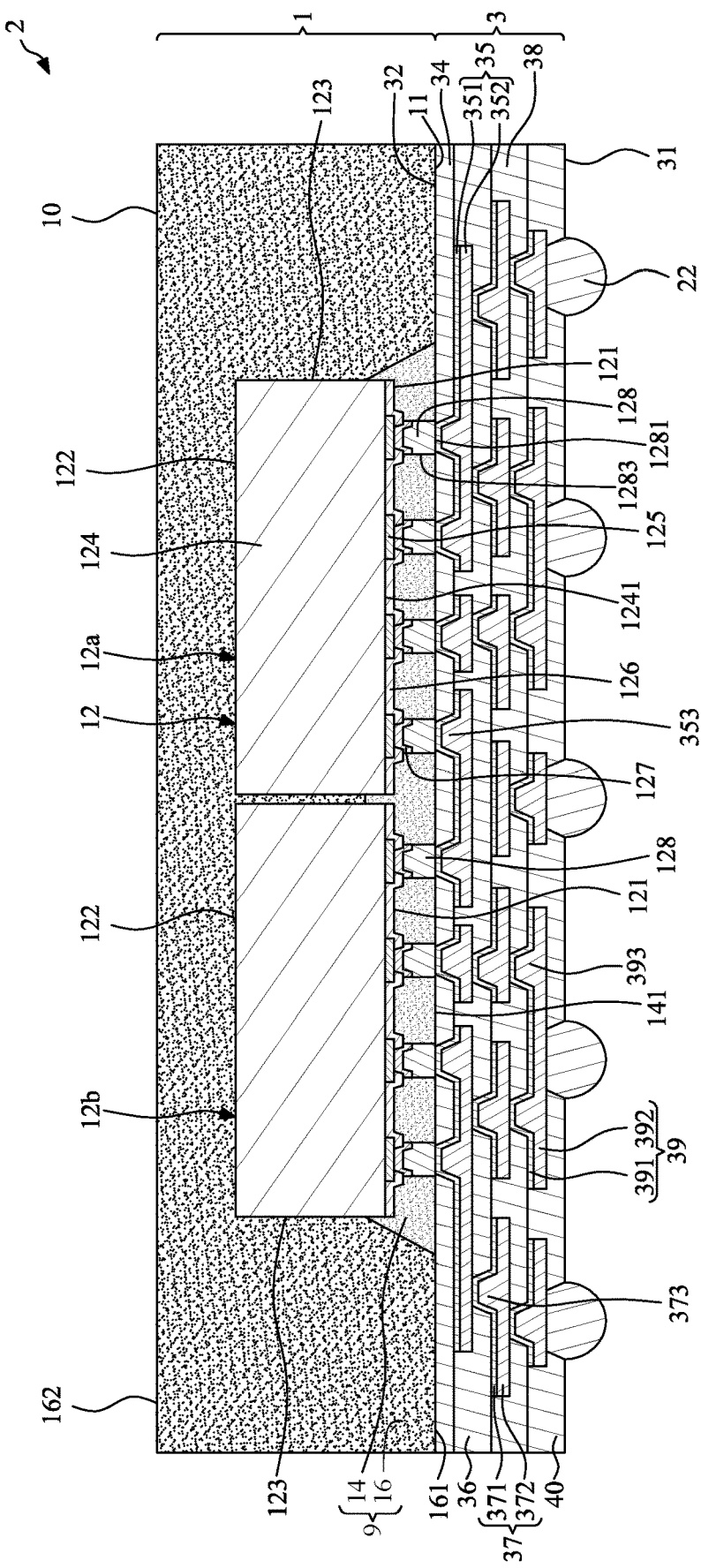
FIG. 5 illustrates a cross-sectional view of an assembly structure according to some embodiments of the present disclosure.

FIG. 5 illustrates a cross-sectional view of an assembly structure 2 according to some embodiments of the present disclosure. The assembly structure 2 may include a package structure 1, a wiring structure 3 and a plurality of external connectors 22. The package structure 1 of FIG. 5 may be same as the package structure 1 of FIG. 1 and FIG. 2. The wiring structure 3 may be formed, attached or disposed on the first surface 11 of the package structure 1, and electrically connected to the bumps 128 of the at least one electronic device 12 (e.g., the first electronic device 12a and/or the second electronic device 12b).

The wiring structure 3 may be a routing structure or a redistribution layer (RDL), and has a first surface 31 and a second surface 32 opposite to the first surface 31. The second surface 32 of the wiring structure 3 may contact the first surface 11 of the package structure 1. The wiring structure 3 may include at least one dielectric layer (including, for example, a first dielectric layer 34, a second dielectric layer 36, a third dielectric layer 38 and a fourth dielectric layer 40), at least one circuit layer (including, for example, a first circuit layer 35, a second circuit layer 37 and a third circuit layer 39) in contact with or interposed between the dielectric layers 34, 36, 38, 40, and a plurality of conductive vias (including, for example, a plurality of first conductive vias 353, a plurality of second conductive vias 373 and a plurality of third conductive vias 393) embedded in the dielectric layers 34, 36, 38, 40.

In some embodiments, each of the dielectric layers (including, for example, the first dielectric layer 34, the second dielectric layer 36, the third dielectric layer 38 and the fourth dielectric layer 40) may include, or be formed from, a photoresist layer, a passivation layer, a cured photo sensitive material, a cured photoimageable dielectric (PID) material such as epoxy, polypropylene (PP), or polyimide (PI) including photoinitiators, or a combination of two or more thereof.

Each of the circuit layers 35, 37, 39 may include a plurality of traces and a plurality of pads. The circuit layers 35, 37, 39 are electrically connected to one another through the conductive vias (including, for example, the first conductive vias 353, the second conductive vias 373 and the third conductive vias 393). For example, the first dielectric layer 34 is an outermost dielectric layer that is formed or disposed on the first surface 11 of the package structure 1. Thus, the first dielectric layer 34 contacts the protection layer 14 and the encapsulant 16 directly. Further, the first dielectric layer 34 may define a plurality of openings extending through the first dielectric layer 34 and corresponding to the bumps 128. The first circuit layer 35 is an outermost circuit layer that is formed or disposed on the first dielectric layer 34. The first conductive vias 353 are disposed in the openings of the first dielectric layer 34 and extend through the first dielectric layer 34 to contact the bumps 128 directly. Thus, the bumps 128 are electrically connected to the first circuit layer 35 through the first conductive vias 353. In some embodiments, the first circuit layer 35 and the first conductive vias 353 are formed integrally and concurrently. That is, the first conductive vias 353 are portions of the first circuit layer 35. In some embodiments, the first circuit layer 35 and the first conductive vias 353 may include a seed layer 351 and a conductive layer 352 disposed on the seed layer 351. As shown in FIG. 5, the bumps 128 of the at least one electronic device 12 (e.g., the first electronic device 12*a* and/or the second electronic device 12*b*) contact the seed layer 351 of the first conductive vias 353 of the outermost circuit layer (e.g., the first circuit layer 35) of the wiring structure 3 directly. In addition, the first conductive via 353 may taper toward the bump 128 of the at least one electronic device 12 (e.g., the first electronic device 12*a* and/or the second electronic device 12*b*), and a width of a top portion of the first conductive via 353 may be less than or equal to a width of the bump 128 of the at least one electronic device 12 (e.g., the first electronic device 12*a* and/or the second electronic device 12*b*). Thus, an L/S of the first circuit layer 35 may be reduced.

The second dielectric layer 36 is formed or disposed on the first dielectric layer 34 to cover the first circuit layer 35. Further, the second dielectric layer 36 may define a plurality of openings extending through the second dielectric layer 36. The second circuit layer 37 is formed or disposed on the second dielectric layer 36. The second conductive vias 373 are disposed in the openings of the second dielectric layer 36 and extend through the second dielectric layer 36 to contact the first circuit layer 35. Thus, the second circuit layer 37 is electrically connected to the first circuit layer 35 through the second conductive vias 373. In some embodiments, the second circuit layer 37 and the second conductive vias 373 are formed integrally and concurrently. In some embodiments, the second circuit layer 37 and the second conductive vias 373 may include a seed layer 371 and a conductive layer 372 disposed on the seed layer 371. In addition, the second conductive vias 373 may taper upward.

The third dielectric layer 38 is formed or disposed on the second dielectric layer 36 to cover the second circuit layer 37. Further, the third dielectric layer 38 may define a plurality of openings extending through the third dielectric layer 38. The third circuit layer 39 is formed or disposed on the third dielectric layer 38. The third conductive vias 393 are disposed in the openings of the third dielectric layer 38 and extend through the third dielectric layer 38 to contact the second circuit layer 37. Thus, the third circuit layer 39 is electrically connected to the second circuit layer 37 through the third conductive vias 393. In some embodiments, the third circuit layer 39 and the third conductive vias 393 are formed integrally and concurrently. In some embodiments, the third circuit layer 39 and the third conductive vias 393 may include a seed layer 391 and a conductive layer 392 disposed on the seed layer 391. In addition, the third conductive vias 393 may taper upward.

The fourth dielectric layer 40 is formed or disposed on the third dielectric layer 38 to cover the third circuit layer 39. Further, the fourth dielectric layer 40 may define a plurality of openings extending through the fourth dielectric layer 40. The external connectors 22 (e.g., solder materials) are disposed in the openings of the fourth dielectric layer 40 and protrude from the fourth dielectric layer 40 for external connection.

Figure 6:
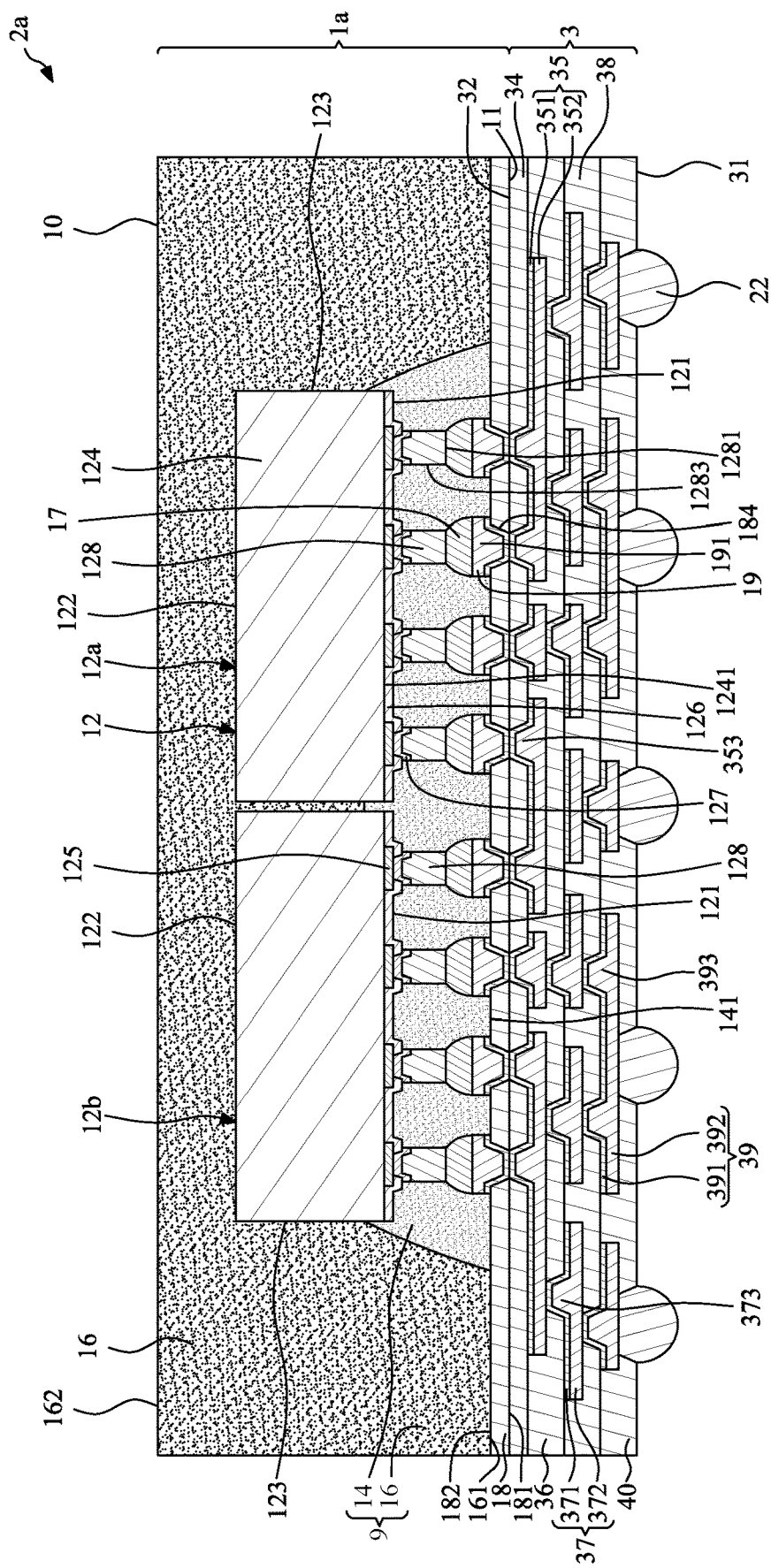
FIG. 6 illustrates a cross-sectional view of an assembly structure according to some embodiments of the present disclosure.

FIG. 6 illustrates a cross-sectional view of an assembly structure 2*a* according to some embodiments of the present disclosure. The assembly structure 2*a* may include a package structure 1*a*, a wiring structure 3 and a plurality of external connectors 22. The package structure 1*a* of FIG. 6 may be same as the package structure 1*a* of FIG. 3. The wiring structure 3 and the external connectors 22 of FIG. 6 may be same as the wiring structure 3 and the external connectors 22 of FIG. 5, respectively. As shown in FIG. 6, the wiring structure 3 may be formed, attached or disposed on the first surface 11 of the package structure 1*a* (e.g., the first surface 181 of the base dielectric layer 18), and electrically connected to the base circuit layer 19 and the bumps 128 of the at least one electronic device 12 (e.g., the first electronic device 12*a* and/or the second electronic device 12*b*).

In some embodiments, the first dielectric layer 34 (e.g., the outermost dielectric layer) of the wiring structure 3 is formed or disposed on the first surface 11 of the package structure 1*a*. Thus, the first dielectric layer 34 contacts the base dielectric layer 18 directly. Further, the first dielectric layer 34 may define a plurality of openings extending through the first dielectric layer 34 and corresponding to the pads 191 of the base circuit layer 19. The first circuit layer 35 is formed or disposed on the first dielectric layer 34. The first conductive vias 353 are disposed in the openings of the first dielectric layer 34 and extend through the first dielectric layer 34 to contact the base circuit layer 19 directly. As shown in FIG. 6, a seed layer of the base circuit layer 19 contacts the seed layer 351 of the first conductive vias 353 of the outermost circuit layer (e.g., the first circuit layer 35) of the wiring structure 3 directly. In addition, a tapering direction of the first conductive via 353 of the wiring structure 3 may be different from a tapering direction of the pads 191 of the base circuit layer 19.

Figure 7:
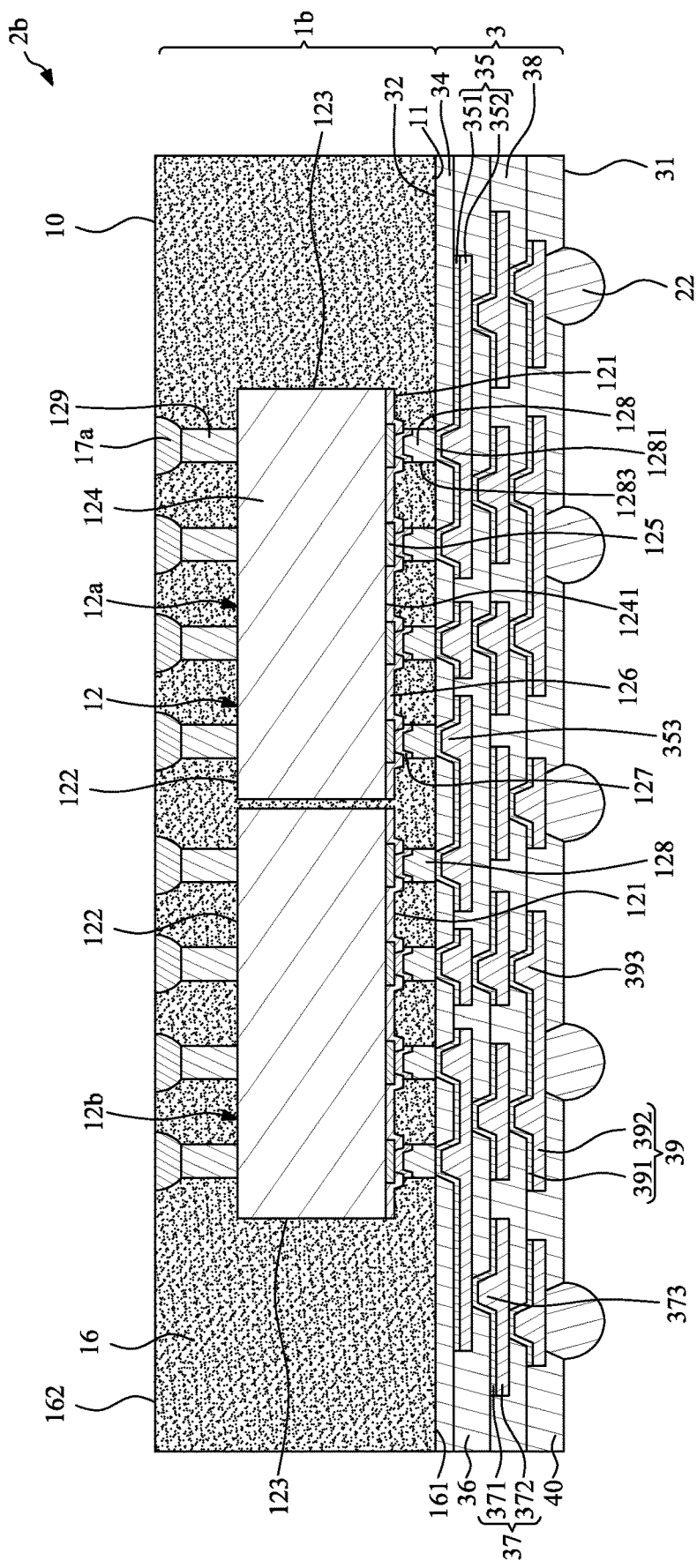
FIG. 7 illustrates a cross-sectional view of an assembly structure according to some embodiments of the present disclosure.

FIG. 7 illustrates a cross-sectional view of an assembly structure 2*b* according to some embodiments of the present disclosure. The assembly structure 2*b* may include a package structure 1*b*, a wiring structure 3 and a plurality of external connectors 22. The package structure 1*b* of FIG. 7 may be same as the package structure 1*b* of FIG. 4. The wiring structure 3 and the external connectors 22 of FIG. 7 may be same as the wiring structure 3 and the external connectors 22 of FIG. 5, respectively. As shown in FIG. 7, the wiring structure 3 may be formed, attached or disposed on the first surface 11 of the package structure 1*b*, and electrically connected to the bumps 128 of the at least one electronic device 12 (e.g., the first electronic device 12*a* and/or the second electronic device 12*b*). Thus, the second surface 32 of the wiring structure 3 may contact the first surface 11 of the package structure 1*a* directly.

Figure 8:
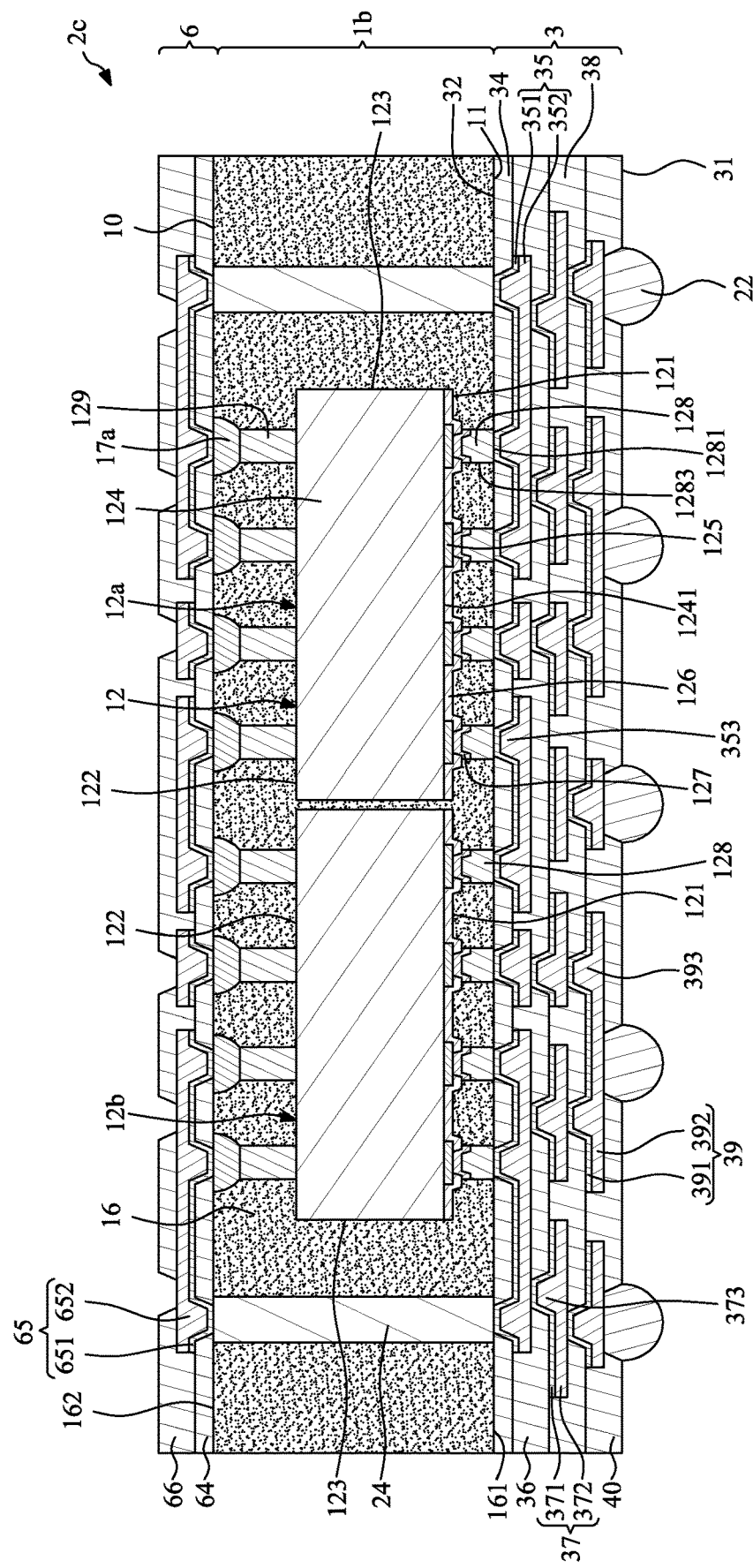
FIG. 8 illustrates a cross-sectional view of an assembly structure according to some embodiments of the present disclosure.

FIG. 8 illustrates a cross-sectional view of an assembly structure 2*c* according to some embodiments of the present disclosure. The assembly structure 2*c* of FIG. 8 is similar to the assembly structure 2*b* of FIG. 7 except that a redistribution layer (RDL) structure 6 and a plurality of through vias 24 are further included. The RDL structure 6 may be formed or disposed on the second surface 162 of the encapsulant 16, and may include at least one dielectric layer (including, for example, a first dielectric layer 64 and a second dielectric layer 66), at least one circuit layer (including, for example, a first circuit layer 65) in contact with or interposed between the dielectric layers 64, 66. In some embodiments, the first circuit layer 65 may include a seed layer 651 and a conductive layer 652 disposed on the seed layer 651, and may extend through the first dielectric layer 64 to contact the self-aligning materials 17a. In addition, the pillars 129 may be functional pillars that have electrical function. As shown in FIG. 8, the through vias 24 may extend through the encapsulant 16 to electrically connect the first circuit layer 65 of the RDL structure 6 and the first circuit layer 35 of the wiring structure 3.

Figure 9:
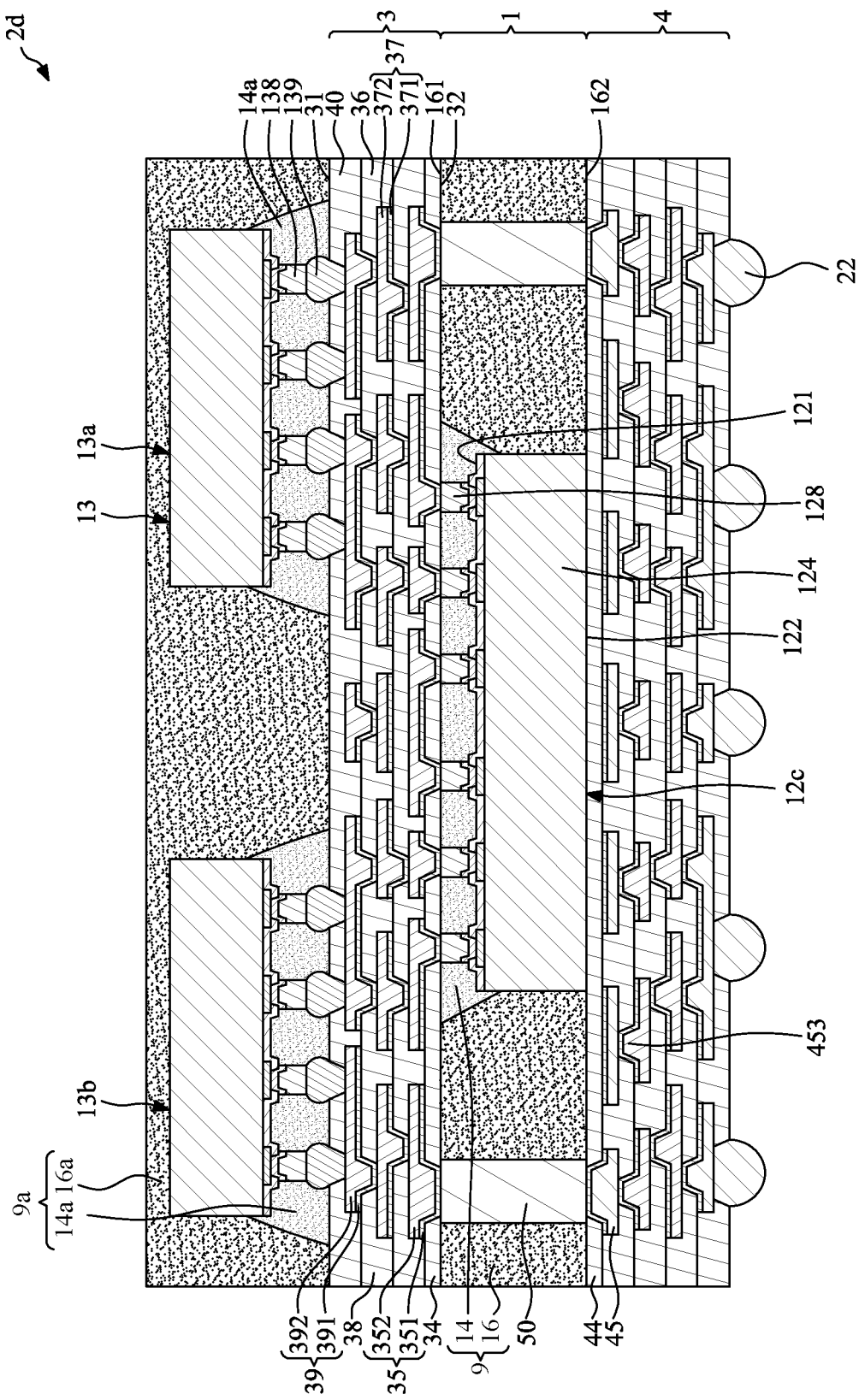
FIG. 9 illustrates a cross-sectional view of an assembly structure according to some embodiments of the present disclosure.

FIG. 9 illustrates a cross-sectional view of an assembly structure 2d according to some embodiments of the present disclosure. The assembly structure 2d may include a package structure 1, a wiring structure 3, a plurality of upper electronic devices 13 (e.g., the first upper electronic device 13a and the upper second electronic device 13b), an upper package body 9a (which includes upper protection layer 14a and an upper encapsulant 16a), a plurality of through vias 50, a lower wiring structure 4 and a plurality of external connectors 22. The package structure 1 and the wiring structure 3 of FIG. 9 may be same as the package structure 1 and the wiring structure 3 of FIG. 5, respectively. As shown in FIG. 9, the electronic device 12c may be a single die or a single chip that is used for communicating the upper electronic devices 13 (e.g., the first upper electronic device 13a and the upper second electronic device 13b). That is, the electronic device 12c may be a bridge die or a bridge chip.

The upper electronic devices 13 (e.g., the first upper electronic device 13a and the upper second electronic device 13b) may be electrically connected to the third circuit layer 39 of the wiring structure 3 through a plurality of bumps 138 and a plurality of self-aligning materials 137 (e.g., solder materials). One of the first upper electronic device 13a and the upper second electronic device 13b may be a processor die, and the other of the first upper electronic device 13a and the upper second electronic device 13b may be a memory die. The upper protection layer 14a (e.g., underfill) may cover the periphery surface of each of the bumps 138 and the first surfaces of the upper electronic devices 13. The upper encapsulant 16a (e.g., molding compound) may cover the upper protection layer 14a and at least portions of the upper electronic devices 13.

The lower wiring structure 4 may be formed on, disposed on or attached to the second surface 10 of the package structure 1 (e.g., the second surface 162 of the encapsulant 16). The lower wiring structure 4 may include at least one dielectric layer 44, at least one circuit layer 45 in contact with or interposed between the dielectric layers 44, and a plurality of conductive vias 453 embedded in the dielectric layers 44. In some embodiments, each of the dielectric layers 44 may include, or be formed from, a photoresist layer, a passivation layer, a cured photo sensitive material, a cured photoimageable dielectric (PID) material such as epoxy, polypropylene (PP), or polyimide (PI) including photoinitiators, or a combination of two or more thereof. Each of the circuit layers 45 may include a plurality of traces and a plurality of pads. The circuit layers 45 are electrically connected to one another through the conductive vias 453. In addition, the conductive vias 453 may taper toward the electronic device 12c. Thus, a tapering direction of the conductive vias (including, for example, the first conductive vias 353, the second conductive vias 373 and the third conductive vias 393) of the wiring structure 3 may be different from a tapering direction of the conductive vias 453 of the lower wiring structure 4. In addition, the external connectors 22 (e.g., solder materials) are attached to the lower wiring structure 4 for external connection.

FIG. 10 through FIG. 19 illustrate a method for manufacturing an assembly structure according to some embodiments of the present disclosure. In some embodiments, the method is for manufacturing the package structure 1 shown in FIG. 1 and FIG. 2, the package structure 1a shown in FIG. 3, and the assembly structure 2 shown in FIG. 5.

Figure 10:
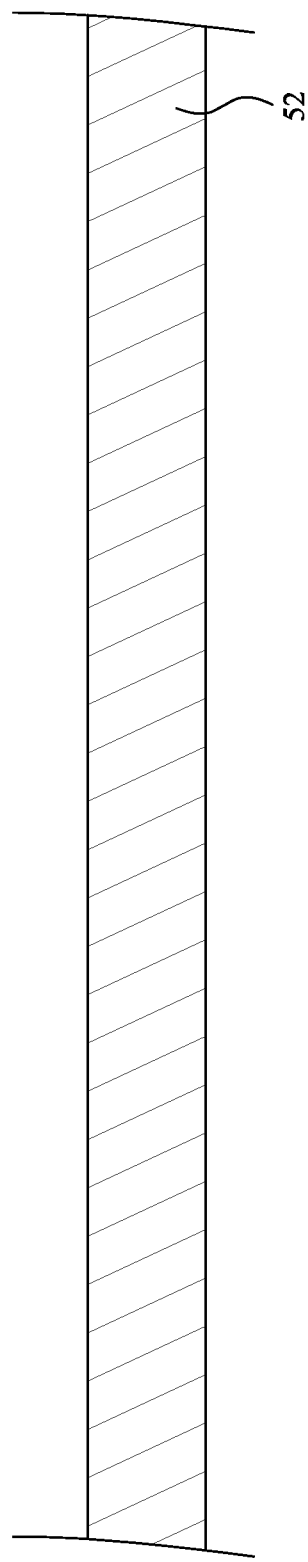
FIG. 10 illustrates one or more stages of an example of a method for manufacturing an assembly structure according to some embodiments of the present disclosure.

Referring to FIG. 10, a carrier 52 is provided.

Figure 11:
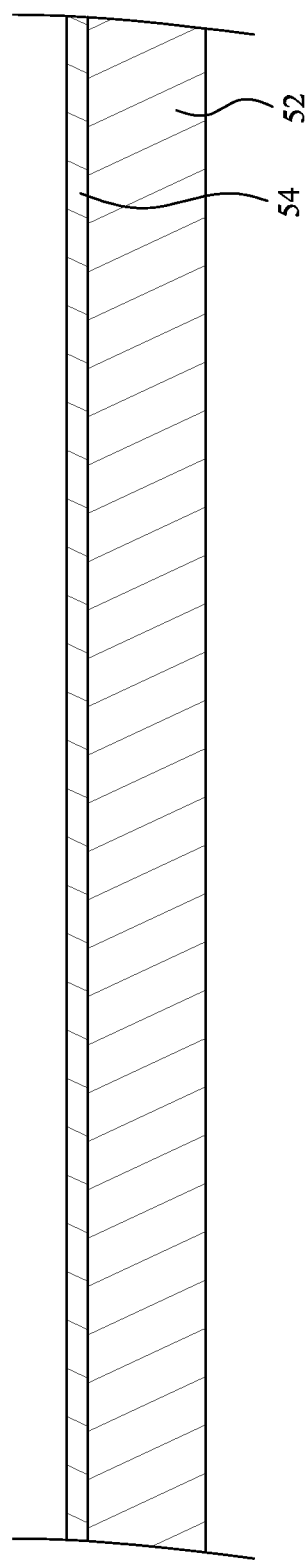
FIG. 11 illustrates one or more stages of an example of a method for manufacturing an assembly structure according to some embodiments of the present disclosure.

Referring to FIG. 11, a release layer 54 is formed or disposed on the carrier 52.

Figure 12:
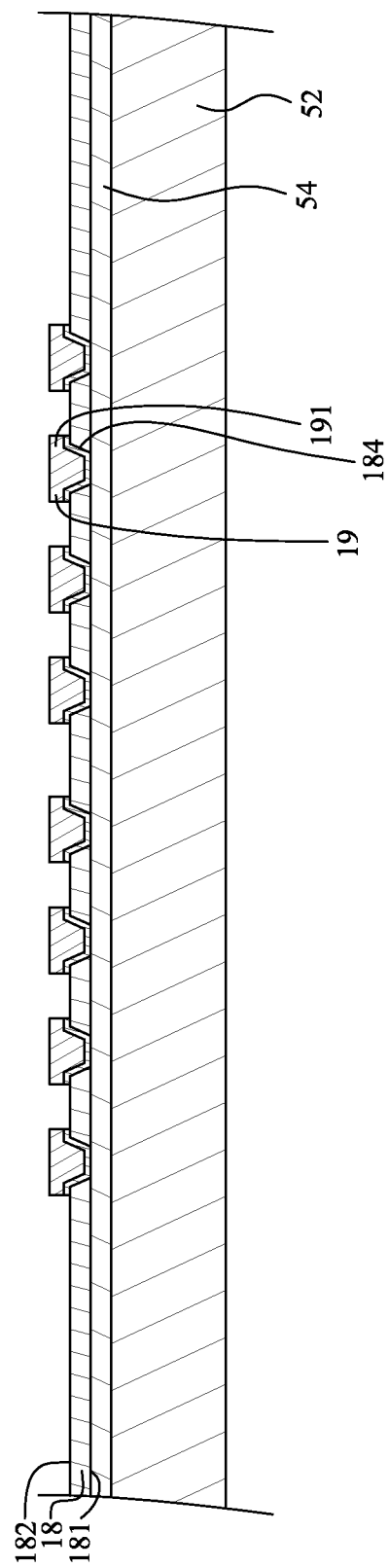
FIG. 12 illustrates one or more stages of an example of a method for manufacturing an assembly structure according to some embodiments of the present disclosure.

Referring to FIG. 12, a base circuit layer 19 is formed or disposed on the release layer 54 on the carrier 52. In some embodiments, a base dielectric layer 18 is formed or disposed on the release layer 54 on the carrier 52. The base dielectric layer 18 may have a first surface 181 and a second surface 182 opposite to the first surface 181. Then, a plurality of openings 184 are formed in the base dielectric layer 18 to extend through the base dielectric layer 18. The openings 184 of the base dielectric layer 18 may taper downward. Then, a base circuit layer 19 is formed or disposed on the base dielectric layer 18 and in the openings 184. As shown in FIG. 12, the base circuit layer 19 may include a plurality of pads 191 embedded in the openings 184 of the base dielectric layer 18 to contact the release layer 54 on the carrier 52, and/or protrude from the second surface 182 of the base dielectric layer 18.

Figure 13:
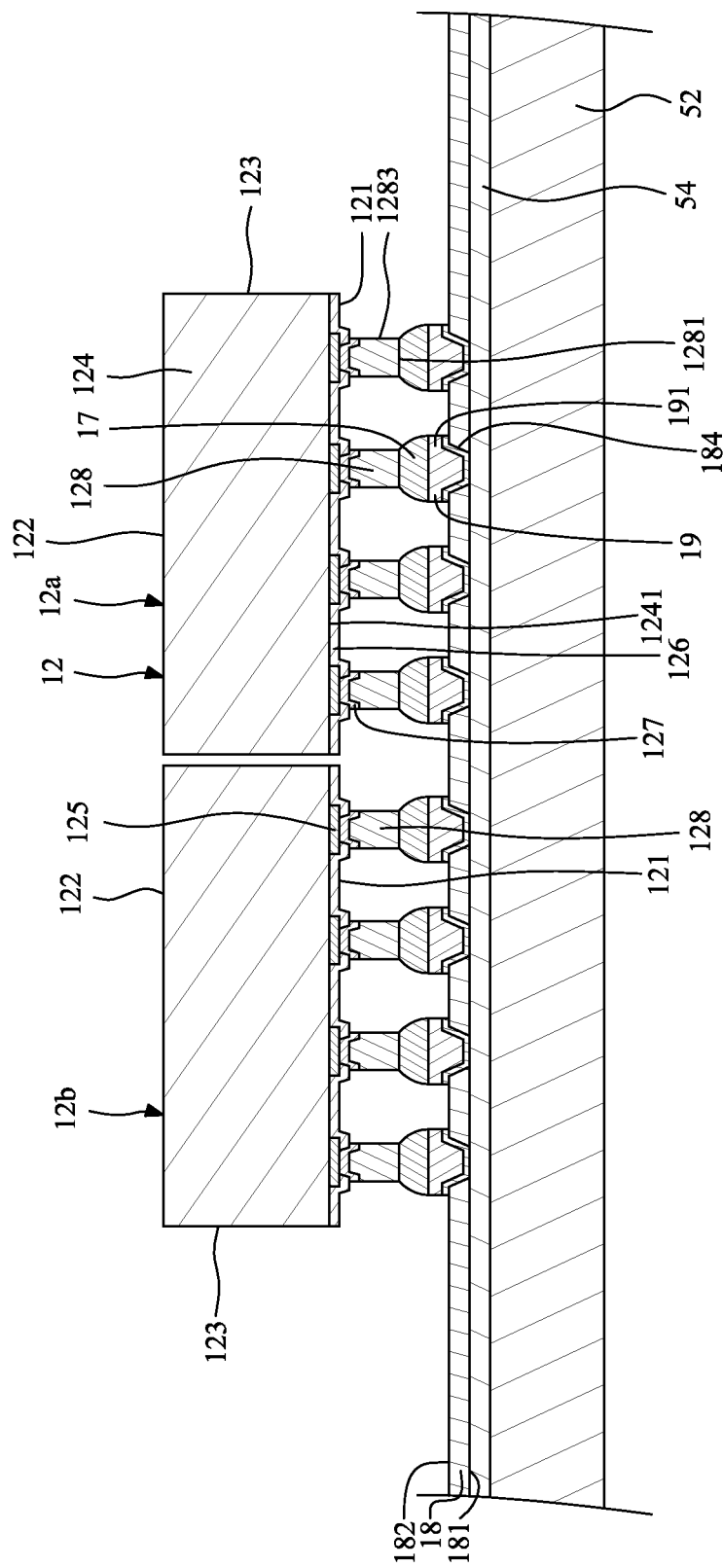
FIG. 13 illustrates one or more stages of an example of a method for manufacturing an assembly structure according to some embodiments of the present disclosure.

Referring to FIG. 13, at least one electronic device 12 (including, for example, a first electronic device 12a and a second electronic device 12b) is provided. In some embodiments, the first electronic device 12a has a first surface 121, a second surface 122 opposite to the first surface 121, and a periphery lateral surface 123 extending between the first surface 121 and the second surface 122. The first electronic device 12a may include a main body 124, a plurality of pads 125, a passivation layer 126, a plurality of under bump metallurgies (UBMs) 127, and a plurality of connecting elements (e.g., bumps 128). The pads 125 may be disposed on a first surface 1241 of the main body 124. Alternatively, the pads 125 may be in proximity to, or embedded in and exposed at the first surface 121 of the first electronic device 12a. In some embodiments, the pads 125 may be included in a circuit layer. The passivation layer 126 covers the pads 125 and the first surface 1241 of the main body 124, and defines a plurality of openings to expose a portion of each of the pads 125. The UBMs 127 are disposed at the openings of the passivation layer 126, and contact the pads 125. The connecting elements (e.g., bumps 128) are disposed on the UBMs 127. Thus, the connecting elements (e.g., bumps 128) are disposed adjacent to the first surface 121 of the first electronic device 12a. Each of the connecting elements (e.g., bumps 128) has a first surface 1281 and a periphery surface 1283.

Then, the connecting elements (e.g., bumps 128) of the at least one electronic device 12 (including, for example, a first electronic device 12a and a second electronic device 12b) are attached to the pads 191 of the base circuit layer 19 through a self-aligning material 17 (e.g., solder material). Before a reflow process, there may be a shift or a misalignment between the connecting elements (e.g., bumps 128) of the at least one electronic device 12 (including, for example, a first electronic device 12a and a second electronic device 12b) and the pads 191 the base circuit layer 19 due to a tolerance of a pick-and-place apparatus. That is, there may be a displacement error (e.g. X direction/Y direction positioning error) and/or a rotation error (e.g. angular positioning error) between the connecting elements (e.g., bumps 128) and the predetermined positions (e.g., the pads 191). During the reflow process, due to the cohesion force of the self-aligning material 17 (e.g., solder material), the connecting elements (e.g., bumps 128) of the at least one electronic device 12 (including, for example, a first electronic device 12a and a second electronic device 12b) are pulled to the predetermined positions (e.g., the pads 191). Thus, after the reflow process, the connecting elements (e.g., bumps 128) of the at least one electronic device 12 (including, for example, a first electronic device 12a and a second electronic device 12b) are aligned with the pads 191. As shown in FIG. 13, the first electronic device 12a and the second electronic device 12b are disposed side by side, and a gap between the first electronic device 12a and the second electronic device 12b may be in a range of 2 µm to 50 µm, or 2 µm to 10 µm.

Figure 14:
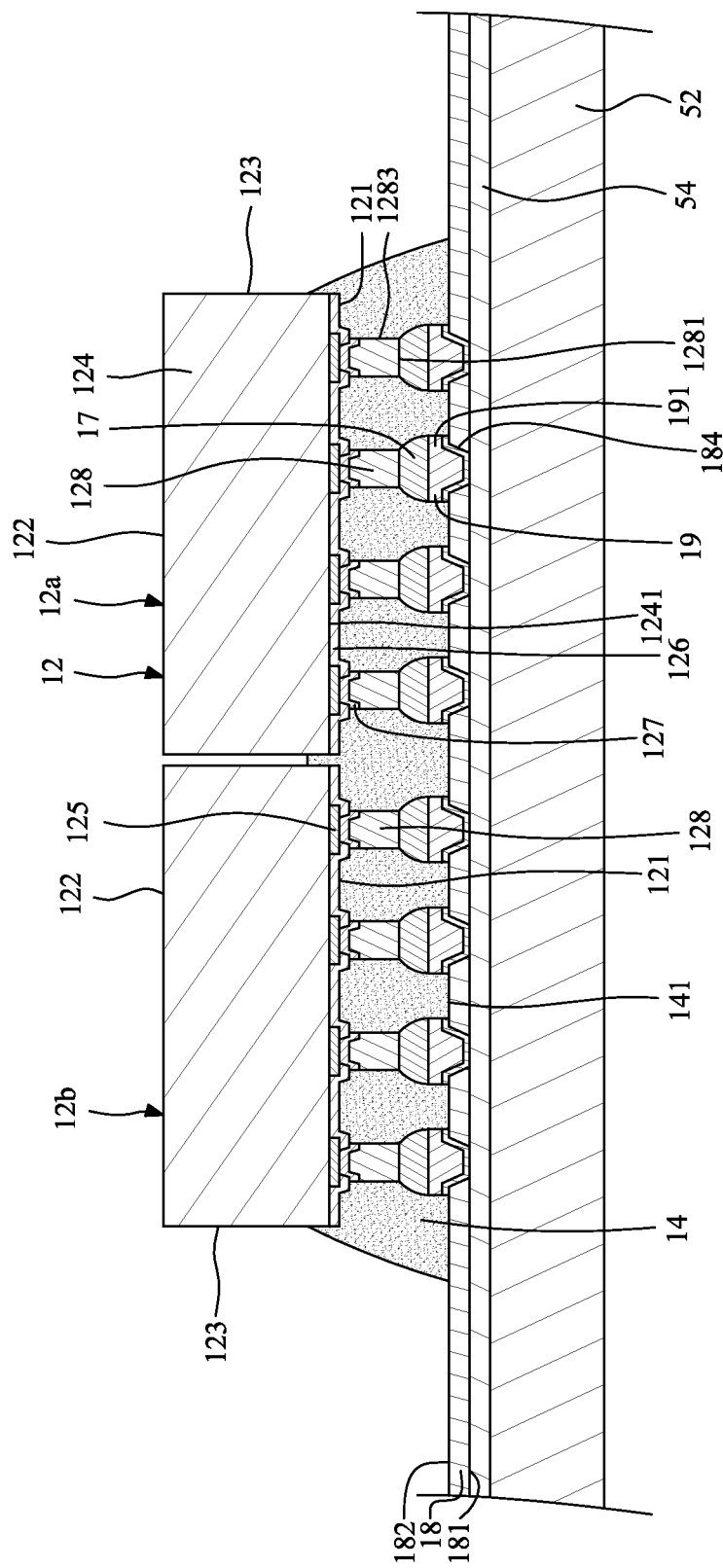
FIG. 14 illustrates one or more stages of an example of a method for manufacturing an assembly structure according to some embodiments of the present disclosure.

Referring to FIG. 14, a protection layer 14 (e.g., underfill) may be formed or disposed in a space between the at least one electronic device 12 (including, for example, a first electronic device 12a and a second electronic device 12b) and the base dielectric layer 18. Thus, the protection layer 14 may cover the periphery surface 1283 of each of the connecting elements (e.g., bumps 128), the first surfaces 121 of the first electronic device 12a and the second electronic device 12b, the self-aligning materials 17, and a portion of the second surface 182 of the base dielectric layer 18.

Figure 15:
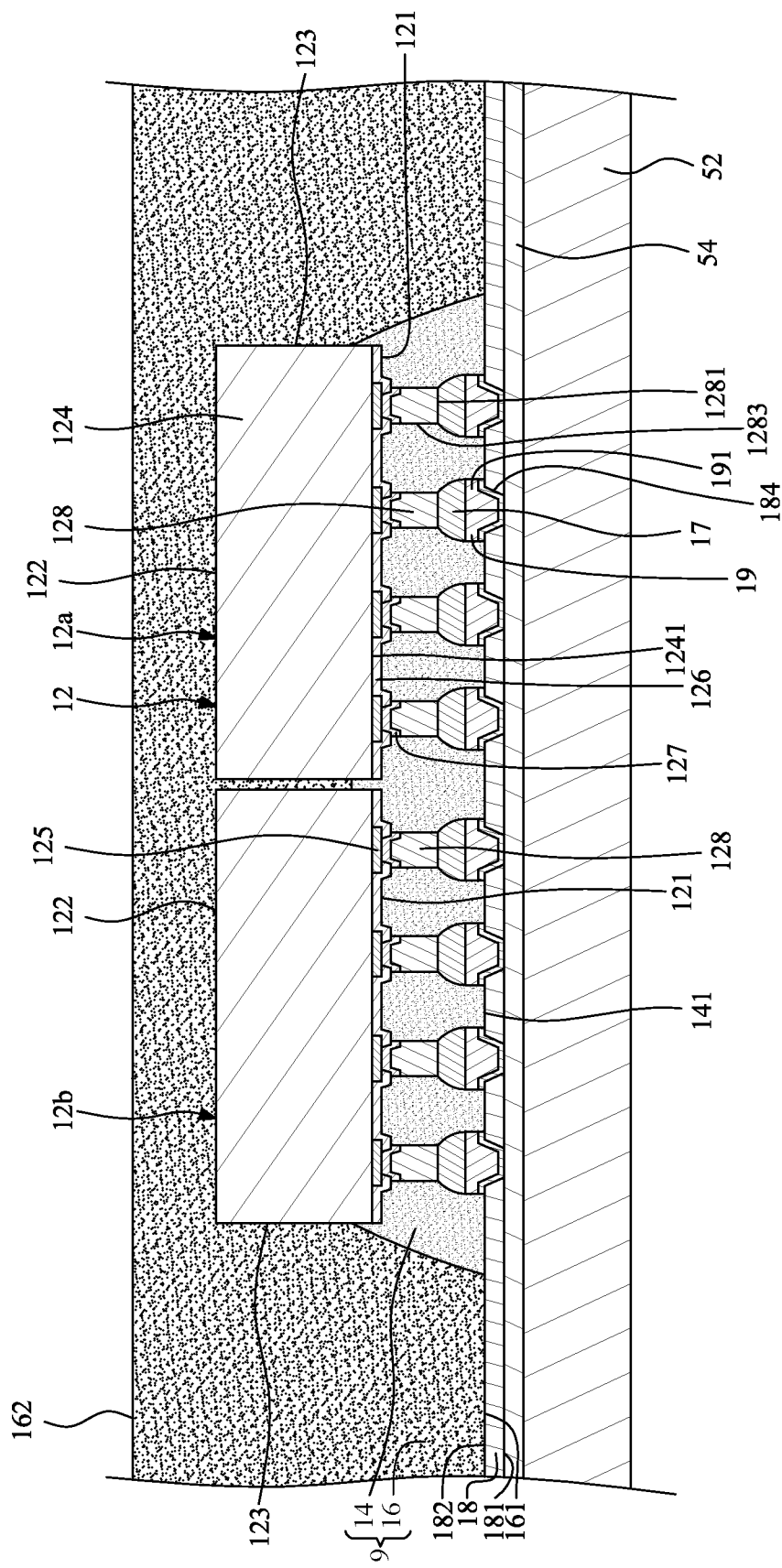
FIG. 15 illustrates one or more stages of an example of a method for manufacturing an assembly structure according to some embodiments of the present disclosure.

Referring to FIG. 15, an encapsulant 16 (e.g., molding compound) may be formed or disposed to cover the protection layer 14, at least portions of the first electronic device 12a and the second electronic device 12b, and a portion of the second surface 182 of the base dielectric layer 18.

Figure 16:
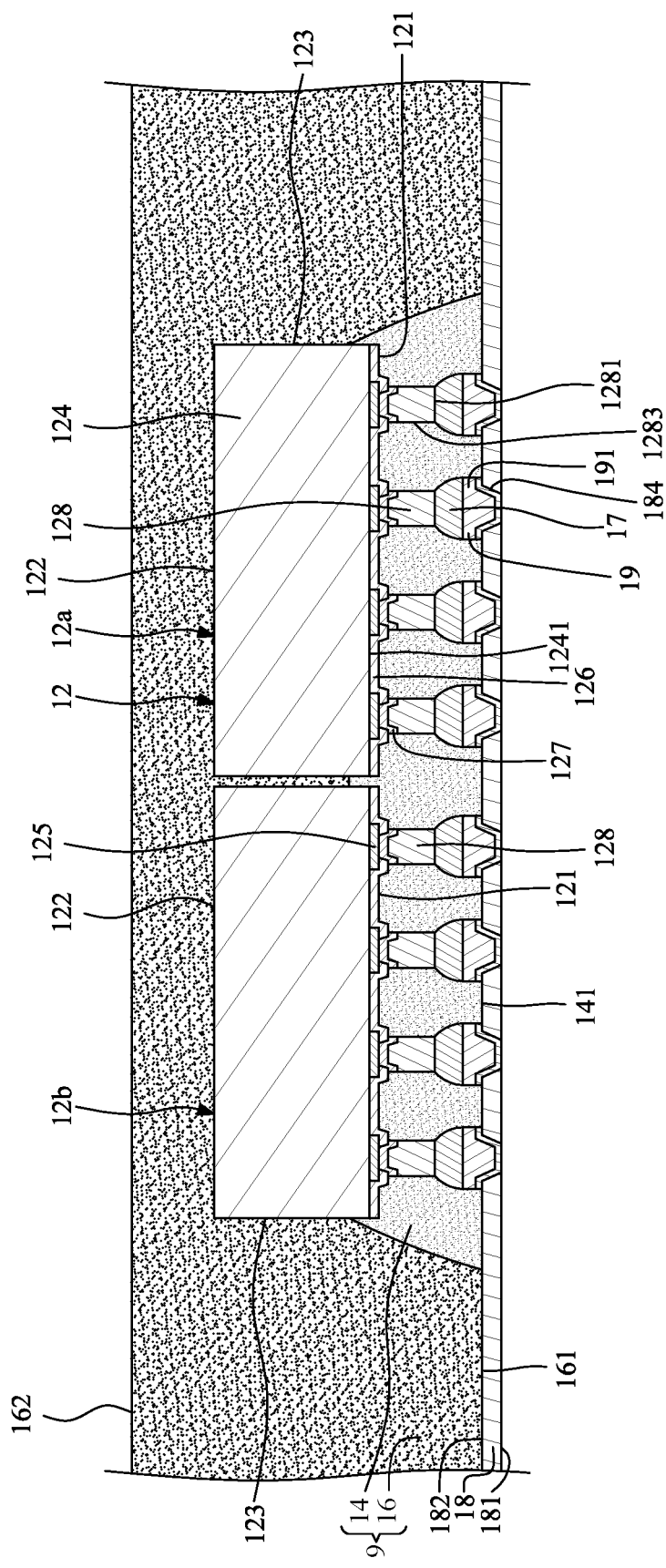
FIG. 16 illustrates one or more stages of an example of a method for manufacturing an assembly structure according to some embodiments of the present disclosure.

Referring to FIG. 16, the release layer 54 and the carrier 52 are removed. In some embodiments, a singulation process may be conducted, thus, a package structure 1a shown in FIG. 3 may be obtained.

Figure 17:
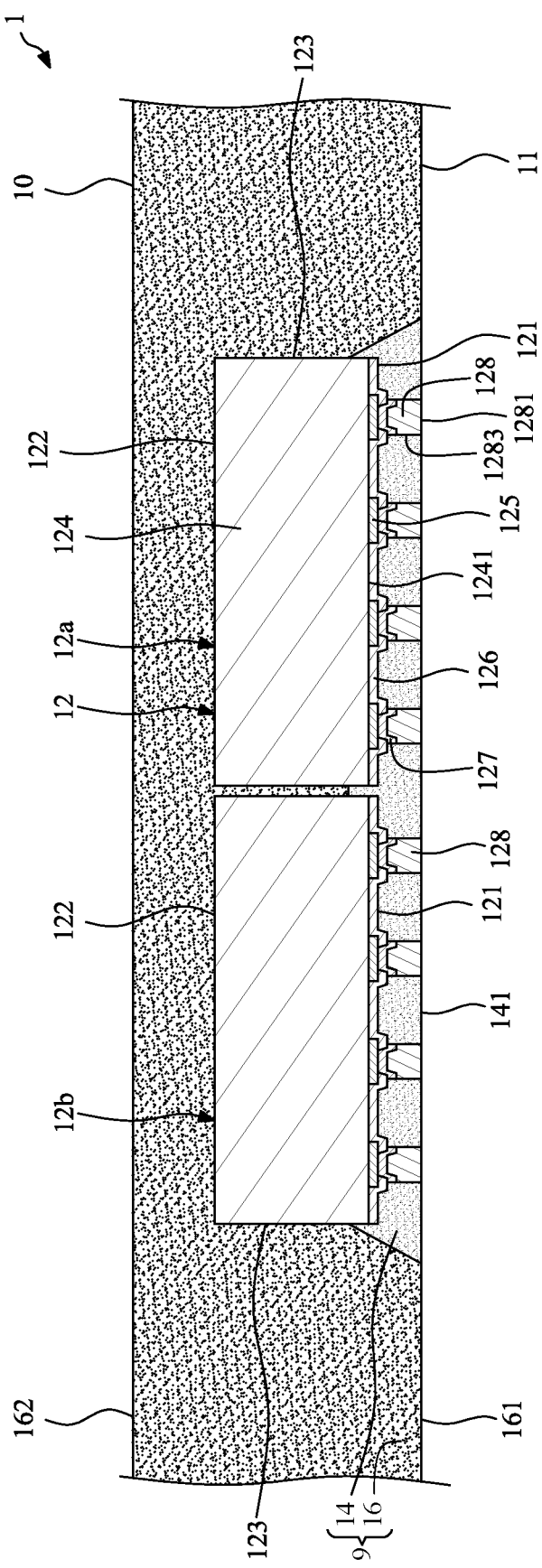
FIG. 17 illustrates one or more stages of an example of a method for manufacturing an assembly structure according to some embodiments of the present disclosure.

Referring to FIG. 17, the base circuit layer 19, the base dielectric layer 18 and the self-aligning material 17 are removed by, for example, grinding. Meanwhile, a package structure 1 shown in FIG. 1 and FIG. 2 may be obtained. In some embodiments, the bottom ends of the bumps 128 may be further removed during the grinding process so that all of the bumps 128 are exposed. Thus, a length of the bump 128 of FIG. 17 may be shorter than a length of the bumps 128 of FIG. 16. In addition, the protection layer 14 may include a plurality of truncated fillers 145 exposed on a first surface 141 of the protection layer 14. The encapsulant 16 may include a plurality of truncated fillers 165 exposed on a first surface 161 of the encapsulant 16. In some embodiments, a particle size of the fillers 144 (FIG. 2) of the protection layer 14 is smaller than a particle size of the fillers 164 (FIG. 2) of the encapsulant 16. Thus, the large particle size of the fillers 164 of the encapsulant 16 may not damage the bumps 128 during the grinding stage.

In some embodiments, the first surfaces 1281 of the bumps 128, the first surface 141 of the protection layer 14 and the first surface 161 of the encapsulant 16 are substantially coplanar with each other, since they may be formed concurrently by a grinding stage. Further, the first surface 11 of the package structure 1 may include the first surfaces 1281 of the bumps 128, the first surface 141 of the protection layer 14 and the first surface 161 of the encapsulant 16. A flatness of the first surface 11 of the package structure 1 may be less than 15 µm, 10 µm or 5 µm, and a surface roughness (Ra) of the first surface 11 of the package structure 1 may be less than 0.1 µm. Thus, a fine line circuit layer may be formed on the first surface 11 of the package structure 1.

Figure 18:
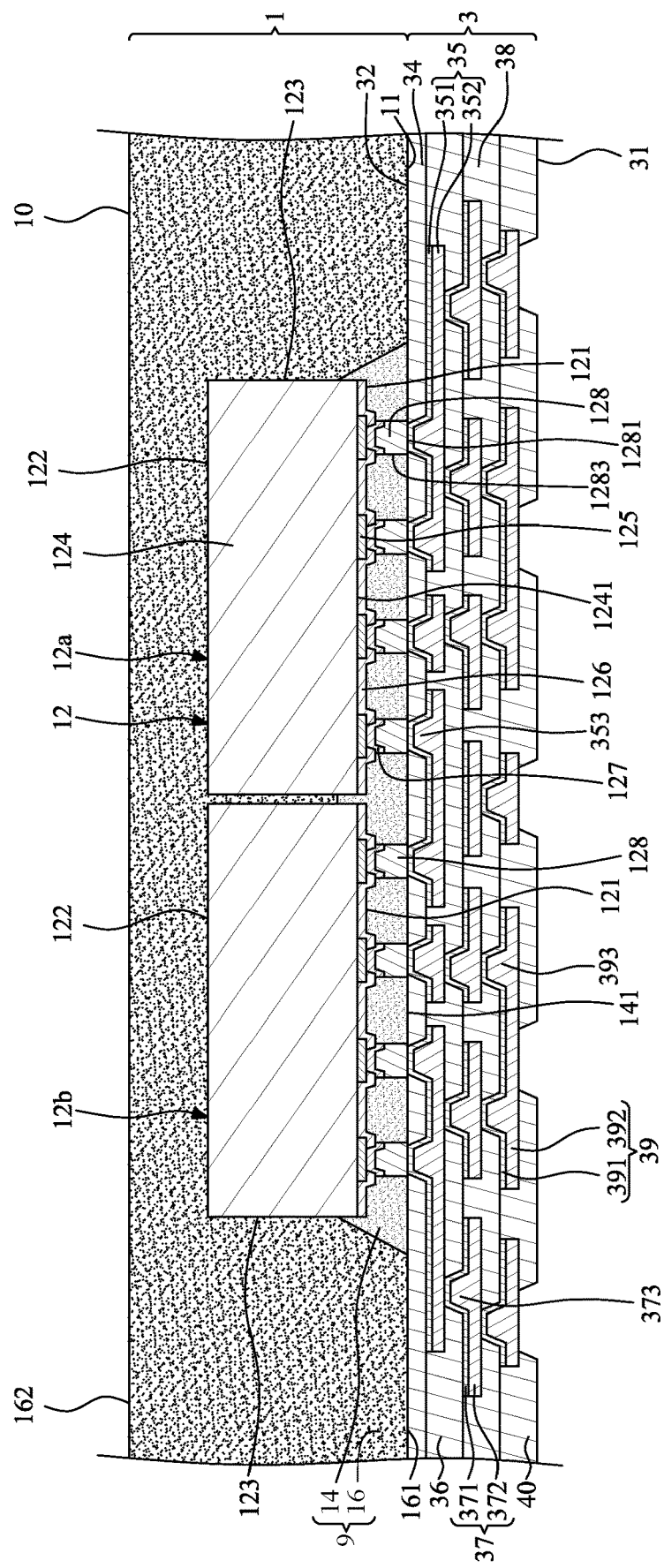
FIG. 18 illustrates one or more stages of an example of a method for manufacturing an assembly structure according to some embodiments of the present disclosure.

Referring to FIG. 18, a wiring structure 3 is formed or disposed on the first surface 11 of the package structure 1 to electrically connect the at least one electronic device 12 (including, for example, a first electronic device 12a and a second electronic device 12b) through the bumps 128. In some embodiments, the wiring structure 3 may be formed on or may contact the first surface 141 of the protection layer 14 and the first surface 161 of the encapsulant 16 directly. As shown in FIG. 18, the wiring structure 3 may have a first surface 31 and a second surface 32 opposite to the first surface 31. The second surface 32 of the wiring structure 3 may contact the first surface 11 of the package structure 1. The wiring structure 3 may include at least one dielectric layer (including, for example, a first dielectric layer 34, a second dielectric layer 36, a third dielectric layer 38 and a fourth dielectric layer 40), at least one circuit layer (including, for example, a first circuit layer 35, a second circuit layer 37 and a third circuit layer 39) in contact with or interposed between the dielectric layers 34, 36, 38, 40, and a plurality of conductive vias (including, for example, a plurality of first conductive vias 353, a plurality of second conductive vias 373 and a plurality of third conductive vias 393) embedded in the dielectric layers 34, 36, 38, 40.

For example, the first dielectric layer 34 is an outermost dielectric layer that is formed or disposed on the first surface 11 of the package structure 1. Thus, the first dielectric layer 34 contacts the protection layer 14 and the encapsulant 16 directly. Further, the first dielectric layer 34 may define a plurality of openings extending through the first dielectric layer 34 and corresponding to the bumps 128. The first circuit layer 35 is an outermost circuit layer that is formed or disposed on the first dielectric layer 34. The first conductive vias 353 are disposed in the openings of the first dielectric layer 34 and extend through the first dielectric layer 34 to contact the bumps 128 directly. Thus, the bumps 128 are electrically connected to the first circuit layer 35 through the first conductive vias 353.

In some embodiments, the first circuit layer 35 and the first conductive vias 353 are formed integrally and concurrently. That is, the first conductive vias 353 are portions of the first circuit layer 35. As shown in FIG. 18, the bumps 128 of the at least one electronic device 12 (e.g., the first electronic device 12a and/or the second electronic device 12b) contact the seed layer 351 of the first conductive vias 353 of the outermost circuit layer (e.g., the first circuit layer 35) of the wiring structure 3 directly. In addition, the first conductive via 353 may taper toward the bump 128 of the at least one electronic device 12 (e.g., the first electronic device 12a and/or the second electronic device 12b), and a width of a top portion of the first conductive via 353 may be less than or equal to a width of the bump 128 of the at least one electronic device 12 (e.g., the first electronic device 12a and/or the second electronic device 12b). Thus, an L/S of the first circuit layer 35 may be reduced.

In some embodiments, the layout of the first conductive vias 353 of the outermost circuit layer (e.g., the first circuit layer 35) of the wiring structure 3 may be substantially the same as the layout of the pads 191 the base circuit layer 19. Thus, the bump 128 of the at least one electronic device 12 (e.g., the first electronic device 12a and/or the second electronic device 12b) may be aligned with the pads 191 the base circuit layer 19.

Figure 19:
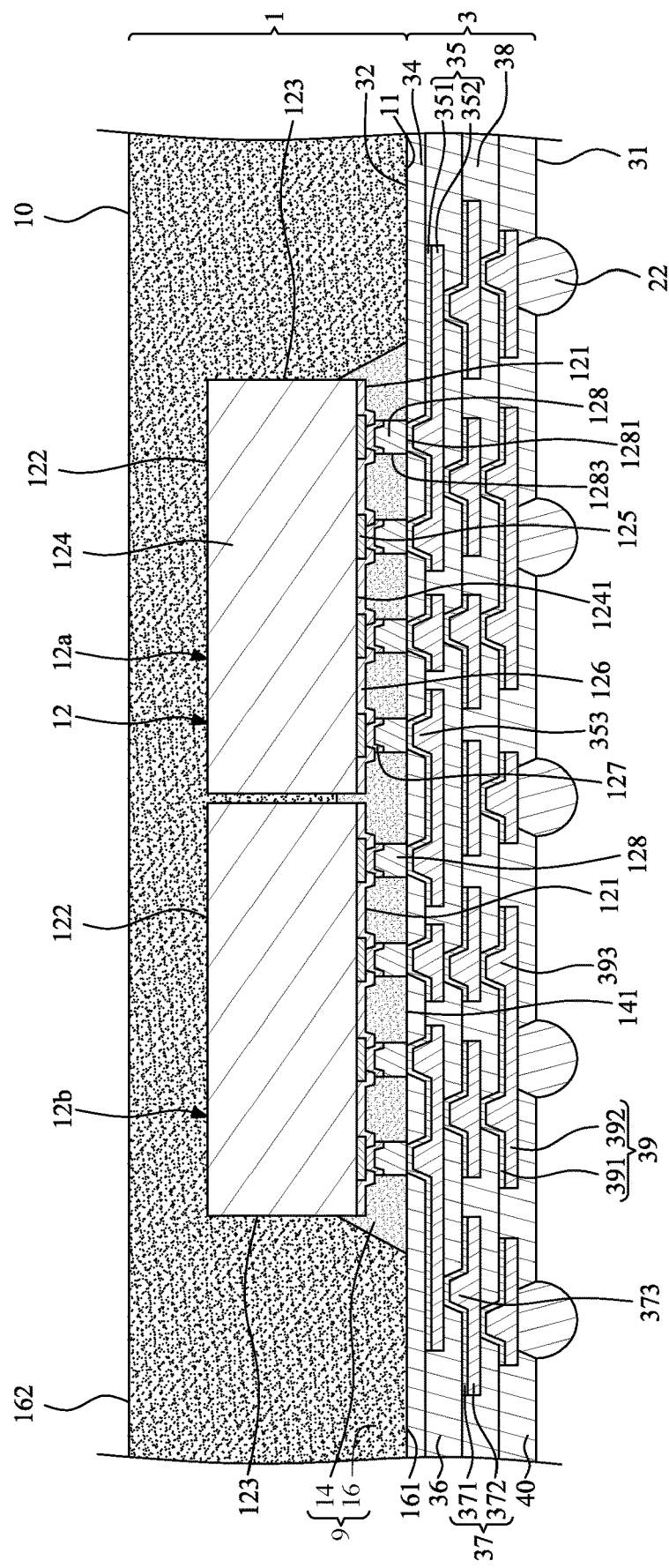
FIG. 19 illustrates one or more stages of an example of a method for manufacturing an assembly structure according to some embodiments of the present disclosure.

Referring to FIG. 19, the external connectors 22 (e.g., solder materials) are formed or disposed in the openings of the fourth dielectric layer 40 and protrude from the fourth dielectric layer 40 for external connection. Then, a singulation process may be conducted so as to obtain a plurality of assembly structures 2 shown in FIG. 5.

FIG. 20 through FIG. 28 illustrate a method for manufacturing an assembly structure according to some embodiments of the present disclosure. In some embodiments, the method is for manufacturing the package structure 1b shown in FIG. 4, the assembly structure 2b shown in FIG. 7, and the assembly structure 2c shown in FIG. 8.

Figure 20:
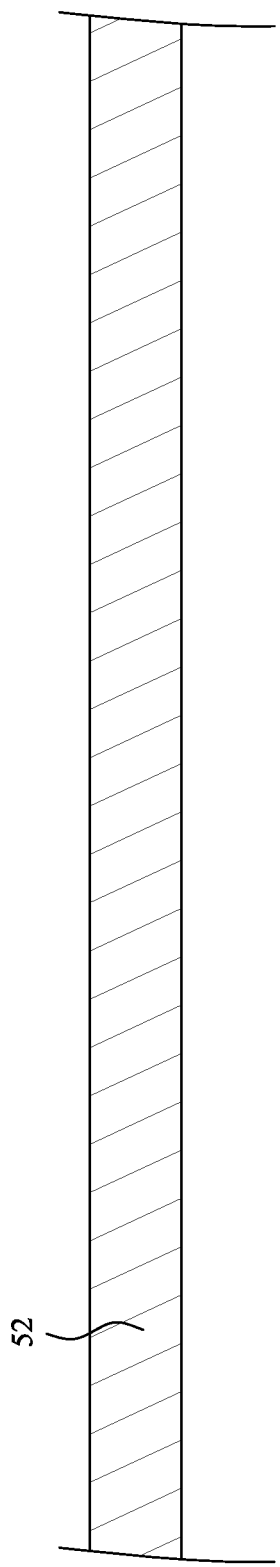
FIG. 20 illustrates one or more stages of an example of a method for manufacturing an assembly structure according to some embodiments of the present disclosure.

Referring to FIG. 20, a carrier 52 is provided.

Figure 21:
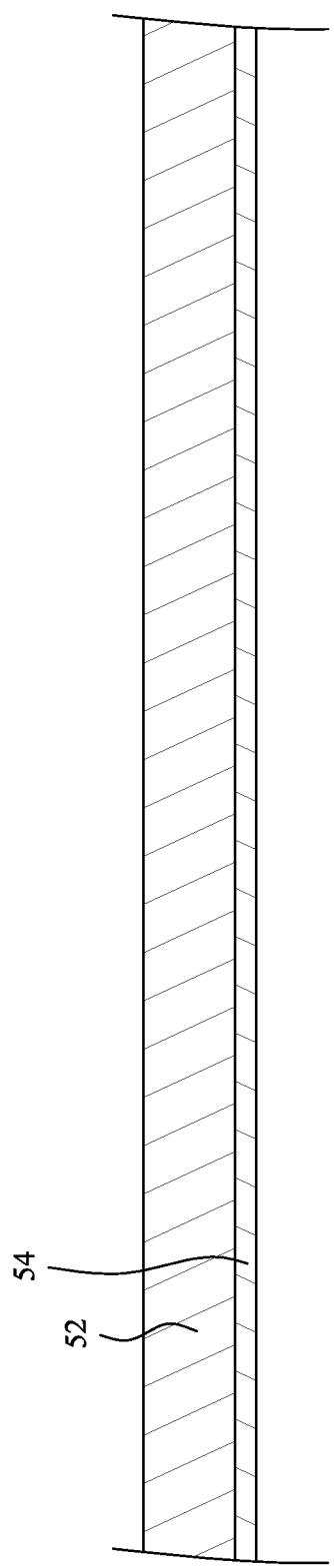
FIG. 21 illustrates one or more stages of an example of a method for manufacturing an assembly structure according to some embodiments of the present disclosure.

Referring to FIG. 21, a release layer 54 is formed or disposed on the carrier 52.

Figure 22:
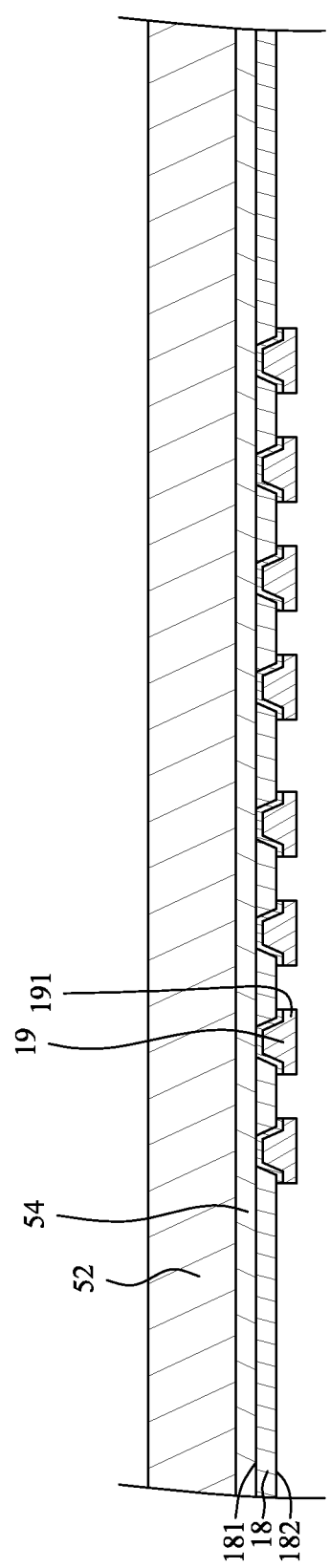
FIG. 22 illustrates one or more stages of an example of a method for manufacturing an assembly structure according to some embodiments of the present disclosure.

Referring to FIG. 22, a base circuit layer 19 is formed or disposed on the release layer 54 on the carrier 52. In some embodiments, a base dielectric layer 18 and a base circuit layer 19 are formed or disposed on the release layer 54 on the carrier 52. The base dielectric layer 18 may have a first surface 181 and a second surface 182 opposite to the first surface 181, and defines a plurality of openings 184. The base circuit layer 19 is formed or disposed on the base dielectric layer 18 and in the openings 184. The base circuit layer 19 may include a plurality of pads 191 embedded in the openings 184 of the base dielectric layer 18 to contact the release layer 54 on the carrier 52, and/or protrude from the second surface 182 of the base dielectric layer 18.

Figure 23:
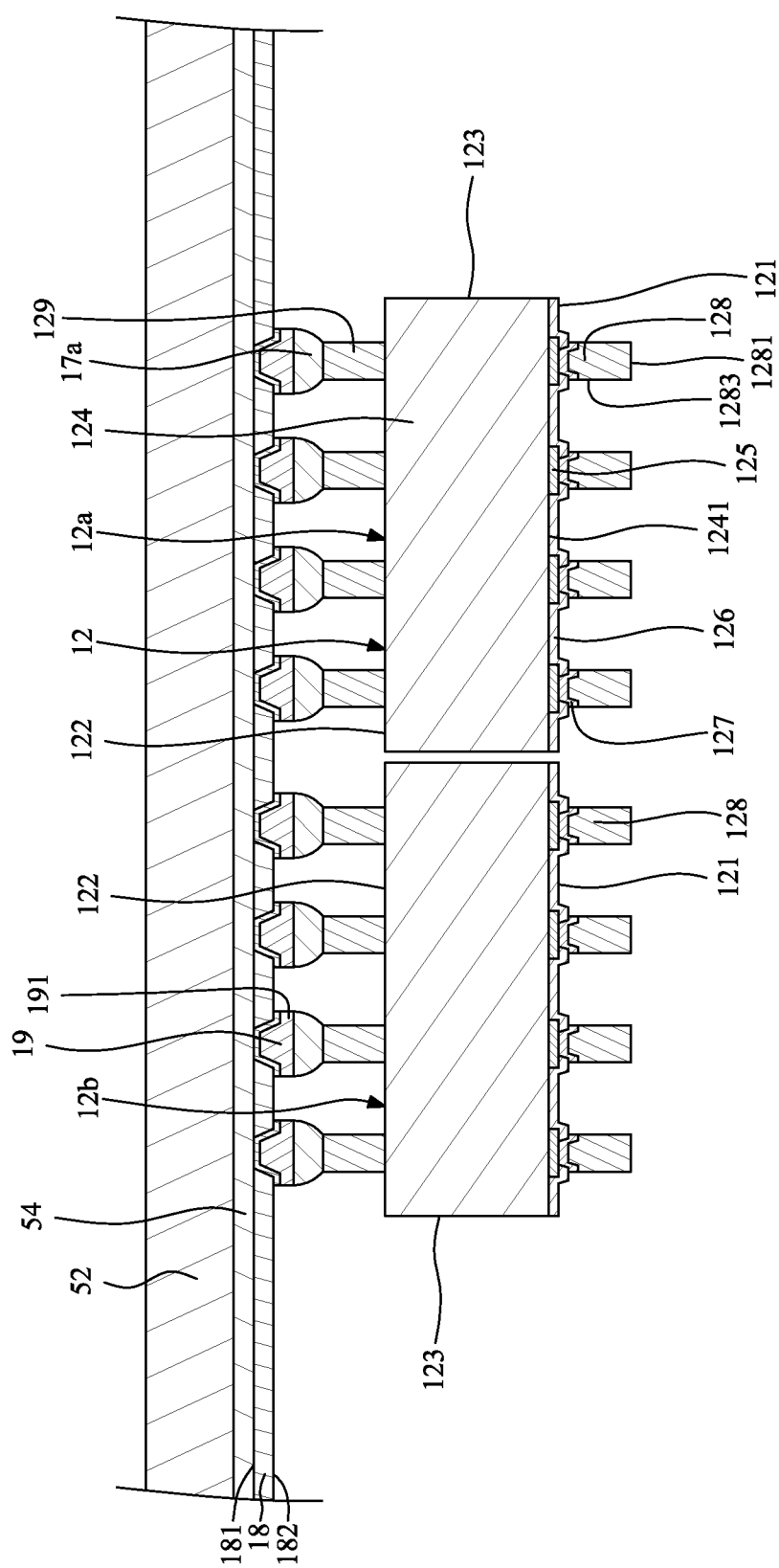
FIG. 23 illustrates one or more stages of an example of a method for manufacturing an assembly structure according to some embodiments of the present disclosure.

Referring to FIG. 23, at least one electronic device 12 (including, for example, a first electronic device 12a and a second electronic device 12b) is provided. In some embodiments, the first electronic device 12a has a first surface 121, a second surface 122 opposite to the first surface 121, and a periphery lateral surface 123 extending between the first surface 121 and the second surface 122. The first electronic device 12a may include a main body 124, a plurality of pads 125, a passivation layer 126, a plurality of under bump metallurgies (UBMs) 127, a plurality of bumps 128, and a plurality of connecting elements (e.g., dummy pillars 129). The pads 125 may be disposed on a first surface 1241 of the main body 124. The passivation layer 126 covers the pads 125 and the first surface 1241 of the main body 124, and defines a plurality of openings to expose a portion of each of the pads 125. The UBMs 127 are disposed at the openings of the passivation layer 126, and contact the pads 125. The bumps 128 are disposed on the UBMs 127. Thus, the bumps 128 are disposed adjacent to the first surface 121 of the first electronic device 12a. Each of the bumps 128 has a first surface 1281 and a periphery surface 1283. The connecting elements (e.g., dummy pillars 129) are disposed on the second surface 122 of the at least one electronic device 12 (including, for example, a first electronic device 12a and a second electronic device 12b).

Then, the connecting elements (e.g., dummy pillars 129) of the at least one electronic device 12 (including, for example, a first electronic device 12a and a second electronic device 12b) are attached to the pads 191 of the base circuit layer 19 through a self-aligning material 17a (e.g., solder material).

Figure 24:
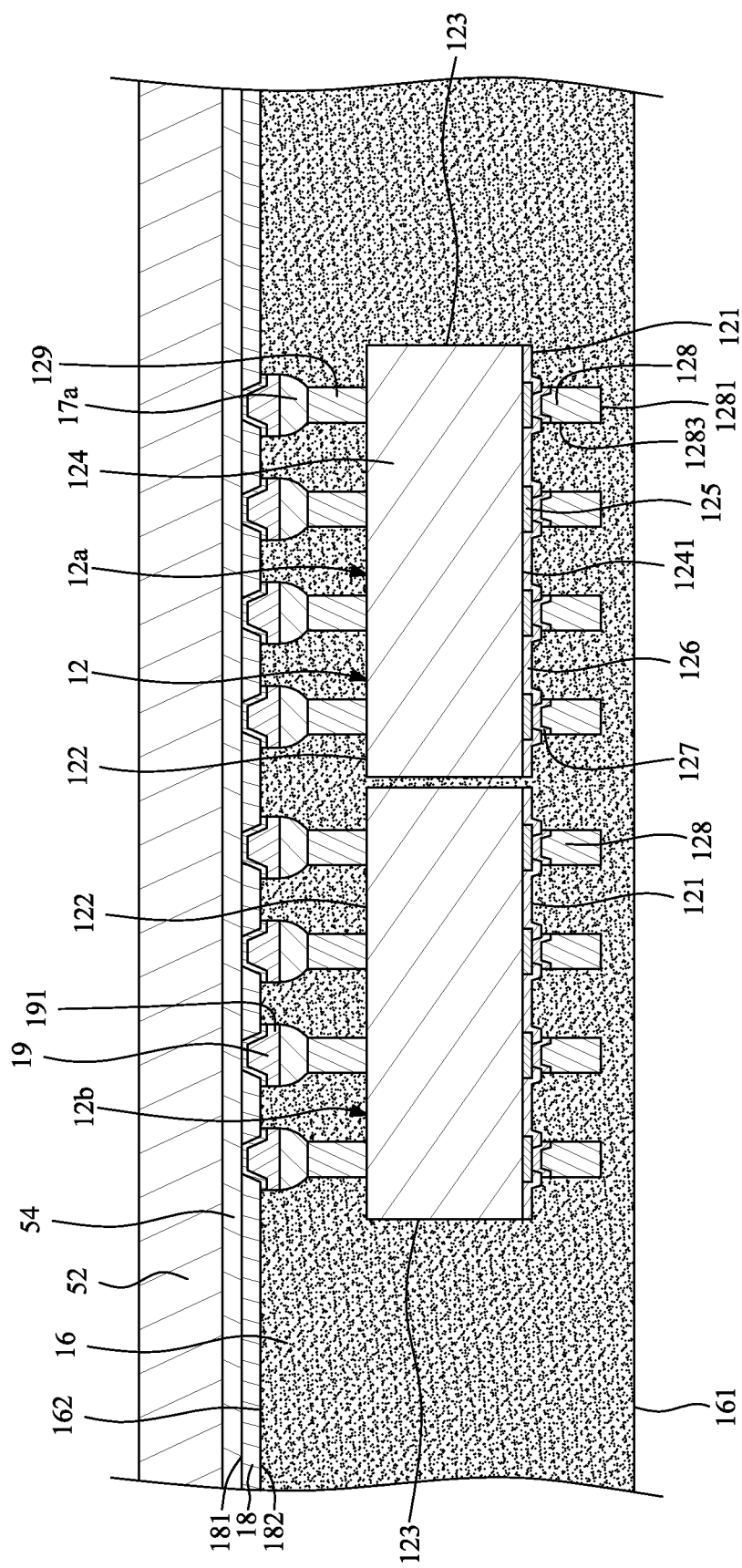
FIG. 24 illustrates one or more stages of an example of a method for manufacturing an assembly structure according to some embodiments of the present disclosure.

Referring to FIG. 24, an encapsulant 16 (e.g., molding compound) may be formed or disposed to cover the at least one electronic device 12 (including, for example, a first electronic device 12a and a second electronic device 12b), the connecting elements (e.g., dummy pillars 129), the self-aligning materials 17a, the bumps 128, and a portion of the second surface 182 of the base dielectric layer 18.

Figure 25:
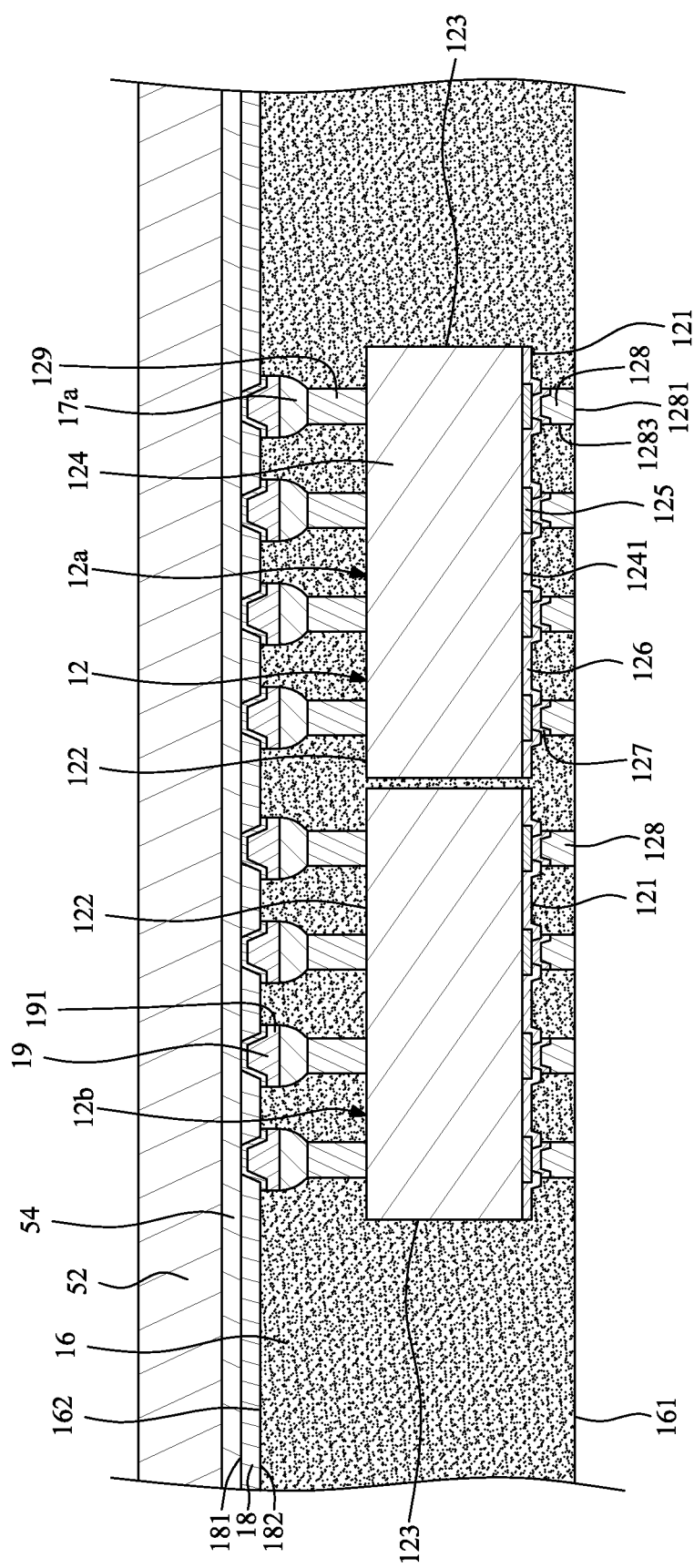
FIG. 25 illustrates one or more stages of an example of a method for manufacturing an assembly structure according to some embodiments of the present disclosure.

Referring to FIG. 25, the encapsulant 16 may be thinned by, for example, grinding, so that the bumps 128 are exposed from the first surface 161 of the encapsulant 16.

Figure 26:
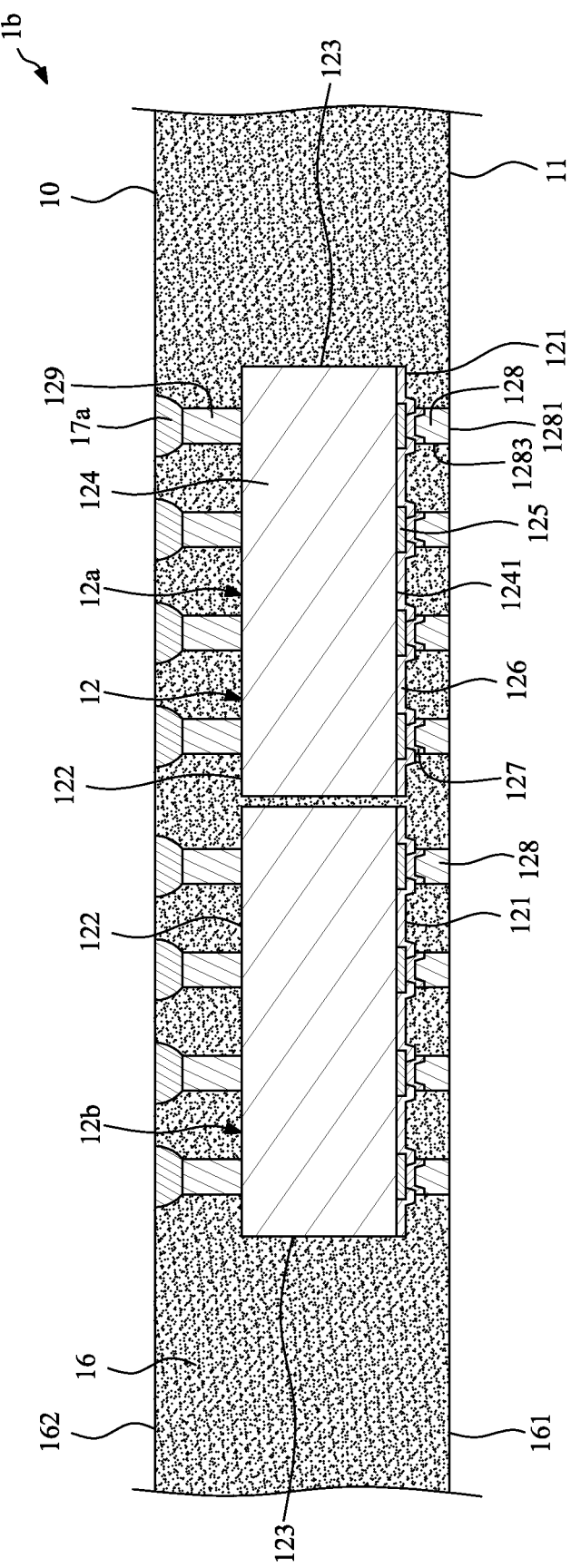
FIG. 26 illustrates one or more stages of an example of a method for manufacturing an assembly structure according to some embodiments of the present disclosure.

Referring to FIG. 26, the release layer 54 and the carrier 52 are removed. Then, the base circuit layer 19 and the base dielectric layer 18 are removed by, for example, grinding. Meanwhile, a package structure 1b shown in FIG. 4 may be obtained. In some embodiments, the self-aligning materials 17a and/or the connecting elements (e.g., dummy pillars 129) may be further removed.

Figure 27:
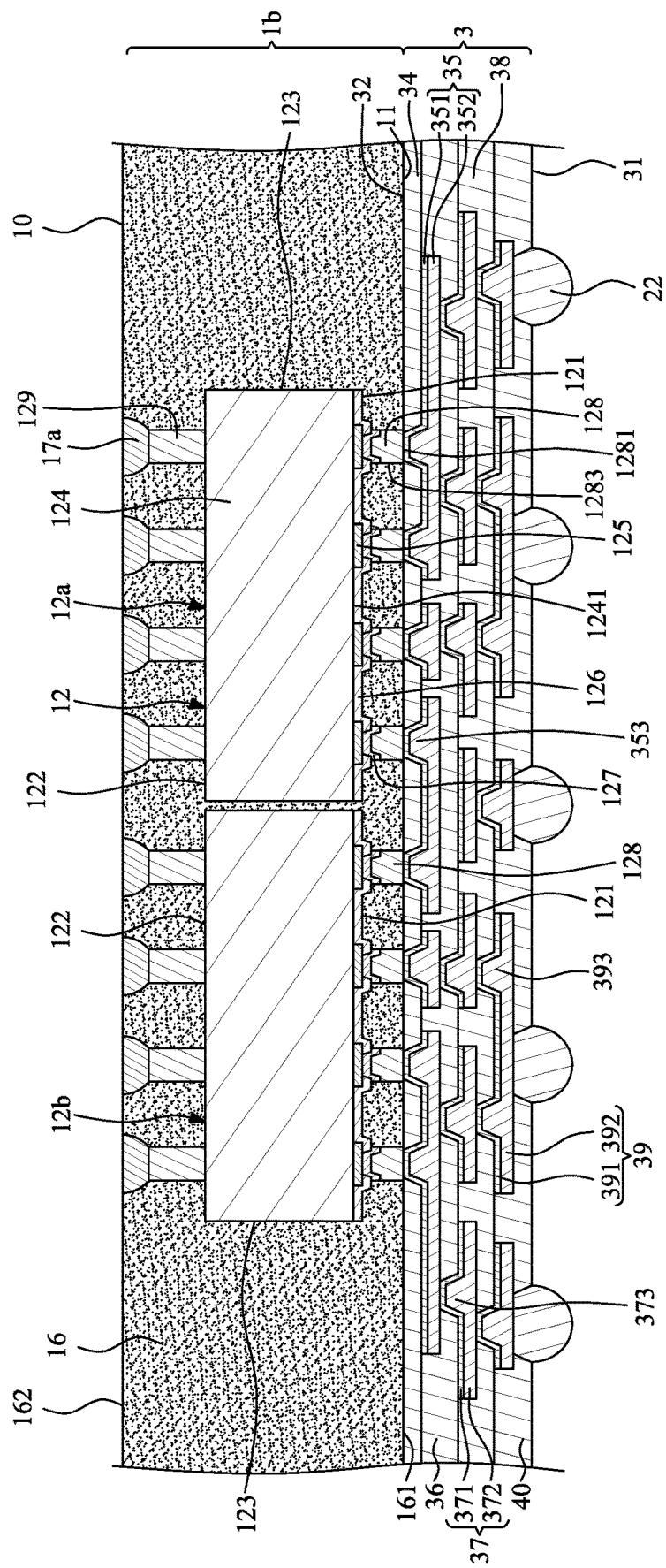
FIG. 27 illustrates one or more stages of an example of a method for manufacturing an assembly structure according to some embodiments of the present disclosure.

Referring to FIG. 27, a wiring structure 3 is formed or disposed on the first surface 161 of the encapsulant 16 to electrically connect the at least one electronic device 12 (including, for example, a first electronic device 12a and a second electronic device 12b) through the bumps 128. In some embodiments, the wiring structure 3 may be formed on or may contact the first surface 161 of the encapsulant 16 directly. As shown in FIG. 27, the wiring structure 3 may have a first surface 31 and a second surface 32 opposite to the first surface 31. The second surface 32 of the wiring structure 3 may contact the first surface 161 of the encapsulant 16. The wiring structure 3 may include at least one dielectric layer (including, for example, a first dielectric layer 34, a second dielectric layer 36, a third dielectric layer 38 and a fourth dielectric layer 40), at least one circuit layer (including, for example, a first circuit layer 35, a second circuit layer 37 and a third circuit layer 39) in contact with or interposed between the dielectric layers 34, 36, 38, 40, and a plurality of conductive vias (including, for example, a plurality of first conductive vias 353, a plurality of second conductive vias 373 and a plurality of third conductive vias 393) embedded in the dielectric layers 34, 36, 38, 40.

In some embodiments, the layout of the first conductive vias 353 of the outermost circuit layer (e.g., the first circuit layer 35) of the wiring structure 3 may be substantially the same as the layout of the pads 191 the base circuit layer 19. Thus, the bump 128 of the at least one electronic device 12 (e.g., the first electronic device 12a and/or the second electronic device 12b) may be aligned with the pads 191 the base circuit layer 19.

Then, the external connectors 22 (e.g., solder materials) are formed or disposed in the openings of the fourth dielectric layer 40 and protrude from the fourth dielectric layer 40 for external connection. Then, in some embodiments, a singulation process may be conducted so as to obtain a plurality of assembly structures shown 2b in FIG. 7.

Figure 28:
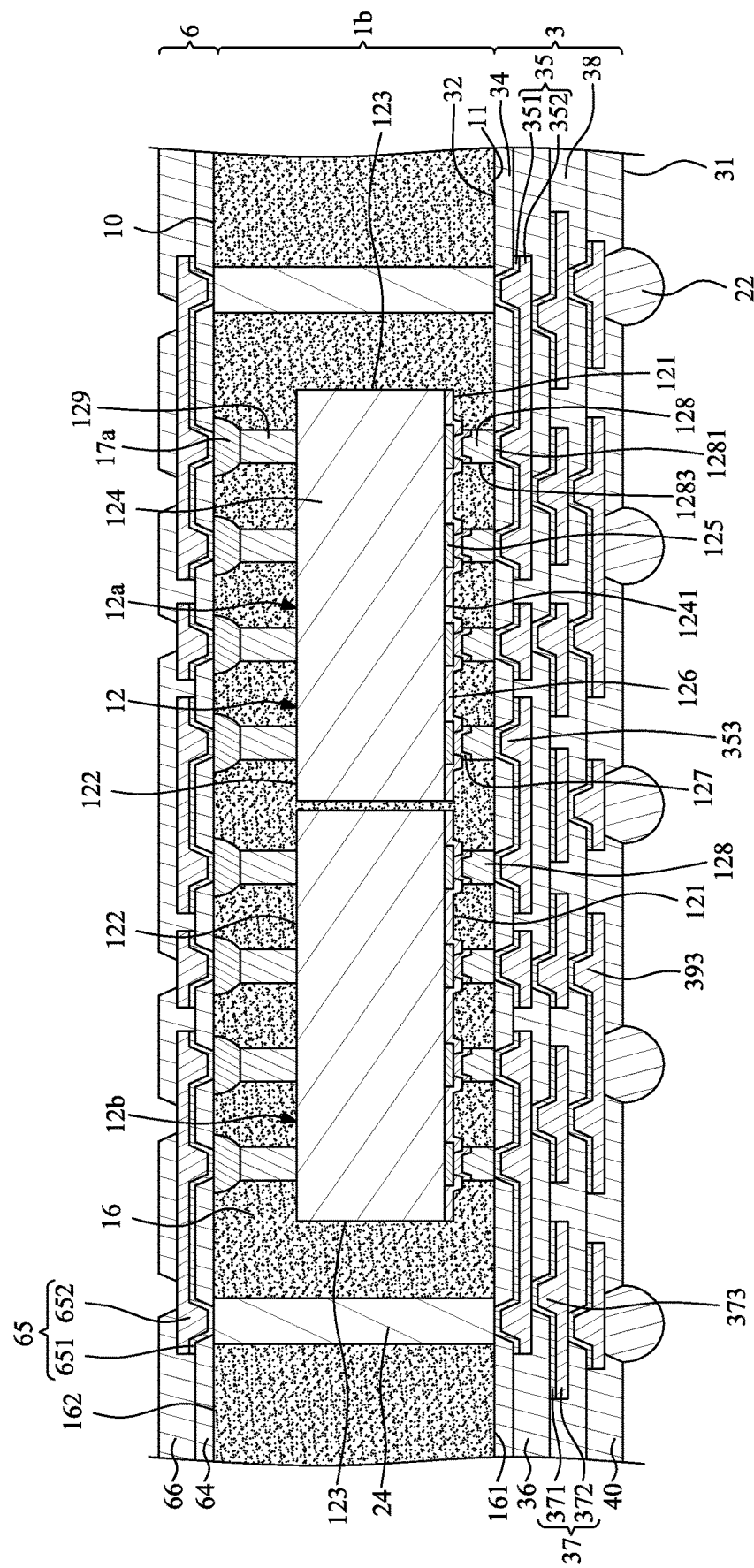
FIG. 28 illustrates one or more stages of an example of a method for manufacturing an assembly structure according to some embodiments of the present disclosure.

Referring to FIG. 28, a plurality of through vias 24 may be formed to extend through the encapsulant 16. Then, a redistribution layer (RDL) structure 6 may be formed or disposed on the second surface 162 of the encapsulant 16. The redistribution layer (RDL) structure 6 may include at least one dielectric layer (including, for example, a first dielectric layer 64 and a second dielectric layer 66), at least one circuit layer (including, for example, a first circuit layer 65) in contact with or interposed between the dielectric layers 64, 66. In some embodiments, the first circuit layer 65 may include a seed layer 651 and a conductive layer 652 disposed on the seed layer 651, and may extend through the first dielectric layer 64 to contact the self-aligning materials 17a. In addition, the pillars 129 may be functional pillars that have electrical function. As shown in FIG. 28, the through vias 24 may electrically connect the first circuit layer 65 of the RDL structure 6 and the first circuit layer 35 of the wiring structure 3. Then, in some embodiments, a singulation process may be conducted so as to obtain a plurality of assembly structures shown 2c in FIG. 8.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A package structure, comprising:
at least one electronic device having a first surface and including a plurality of bumps disposed adjacent to the first surface of the at least one electronic device; and
a package body covering the bumps and a second surface of the at least one electronic device opposite to the first surface of the at least one electronic device, and having a first surface adjacent to the bumps, wherein a portion of the package body includes at least one truncated filler exposed on the first surface of the package body.

2. The package structure of claim 1, wherein each of the bumps is an integral structure.

3. The package structure of claim 1, wherein a cross-section of a periphery surface of each of the bumps is a substantially straight line.

4. The package structure of claim 1, wherein a material of the bumps includes a substantially pure metal.

5. The package structure of claim 1, wherein the package body includes a first portion and a second portion, wherein the first portion of the package body covers the first surface of the at least one electronic device and the bumps, wherein the second portion of the package body covers the first portion and covers a second surface of the at least one electronic device opposite to the first surface of the at least one electronic device and a side surface of the at least one electronic device between the first surface and the second surface of the at least one electronic device, and wherein a first portion and a second portion of the package body defines an interface therebetween.

6. The package structure of claim 5, wherein the first portion tapers from the first surface of the first portion toward the at least one electronic device.

7. The package structure of claim 5, wherein the first portion includes a plurality of fillers, the encapsulant includes a plurality of fillers, and a particle size of the fillers of the first portion is smaller than a particle size of the fillers of the encapsulant.

8. The package structure of claim 5, wherein the first portion includes a plurality of truncated fillers exposed on the first surface of the first portion.

9. The package structure of claim 5, wherein the first surface of each of the bumps and the first surface of the package body are substantially coplanar with each other.

10. The package structure of claim 9, further comprising a wiring structure includes a seed layer and a conductive layer disposed on the seed layer, wherein the bumps of the at least one electronic device contact the seed layer, and wherein the conductive layer is configured to electrically connected to the bumps through the seed layer.

11. The package structure of claim 1, wherein the at least one electronic device includes a plurality of electronic devices, wherein a gap is between the electronic devices, and wherein the package body is formed in the gap.

12. The package structure of claim 11, wherein the package body includes a first portion and a second portion, wherein the first portion of the package body covers the first surface of the at least one electronic device and the bumps, wherein the second portion the package body covers the first portion and covers the second surface of the at least one electronic device and a side surface of the at least one electronic device between the first surface and the second surface of the at least one electronic device, and wherein the first portion and the second portion defines an interface therebetween.

13. The package structure of claim 12, wherein the first portion is in the gap.

14. The package structure of claim 12, wherein the first portion includes a plurality of fillers, the second portion includes a plurality of fillers, and a particle size of the fillers of the first portion is smaller than a particle size of the fillers of the second portion.

15. The package structure of claim 12, wherein the first portion includes at least one truncated filler exposed on the first surface of the first portion.

* * * * *